(12) United States Patent
Tiwari et al.

(10) Patent No.: US 11,302,712 B2
(45) Date of Patent: Apr. 12, 2022

(54) INTEGRATED CIRCUITRY, MEMORY ARRAYS COMPRISING STRINGS OF MEMORY CELLS, METHODS USED IN FORMING INTEGRATED CIRCUITRY, AND METHODS USED IN FORMING A MEMORY ARRAY COMPRISING STRINGS OF MEMORY CELLS

(71) Applicant: Micron Technology, Inc., Boise, ID (US)

(72) Inventors: Chandra Tiwari, Boise, ID (US); Jivaan Kishore Jhothiraman, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 16/856,847

(22) Filed: Apr. 23, 2020

(65) Prior Publication Data
US 2021/0335803 A1   Oct. 28, 2021

(51) Int. Cl.
| | |
|---|---|
| *H01L 27/11582* | (2017.01) |
| *H01L 27/11556* | (2017.01) |
| *H01L 21/02* | (2006.01) |
| *H01L 27/11565* | (2017.01) |
| *H01L 27/11519* | (2017.01) |
| *H01L 29/66* | (2006.01) |
| *H01L 21/311* | (2006.01) |

(52) U.S. Cl.
CPC .. *H01L 27/11582* (2013.01); *H01L 21/02356* (2013.01); *H01L 21/02636* (2013.01); *H01L 21/31111* (2013.01); *H01L 27/11519* (2013.01); *H01L 27/11556* (2013.01); *H01L 27/11565* (2013.01); *H01L 29/66545* (2013.01)

(58) Field of Classification Search
None
See application file for complete search history.

(56) References Cited

U.S. PATENT DOCUMENTS

| | | | | |
|---|---|---|---|---|
| 10,304,852 | B1 * | 5/2019 | Cui | H01L 23/528 |
| 2013/0334591 | A1 * | 12/2013 | Matsuda | H01L 27/1157 257/324 |

\* cited by examiner

*Primary Examiner* — Anthony Ho
*Assistant Examiner* — Kevin Quinto
(74) *Attorney, Agent, or Firm* — Wells St. John P.S.

(57) ABSTRACT

A method used in forming integrated circuitry comprises forming a stack comprising vertically-alternating first tiers and second tiers. The stack comprises a cavity therein that comprises a stair-step structure. At least a portion of sidewalls of the cavity is lined with sacrificial material. Insulative material is formed in the cavity radially inward of the sacrificial material. At least some of the sacrificial material is removed from being between the cavity sidewalls and the insulative material to form a void space there-between. Insulator material is formed in at least some of the void space. Other embodiments, including structure independent of method, are disclosed.

35 Claims, 34 Drawing Sheets

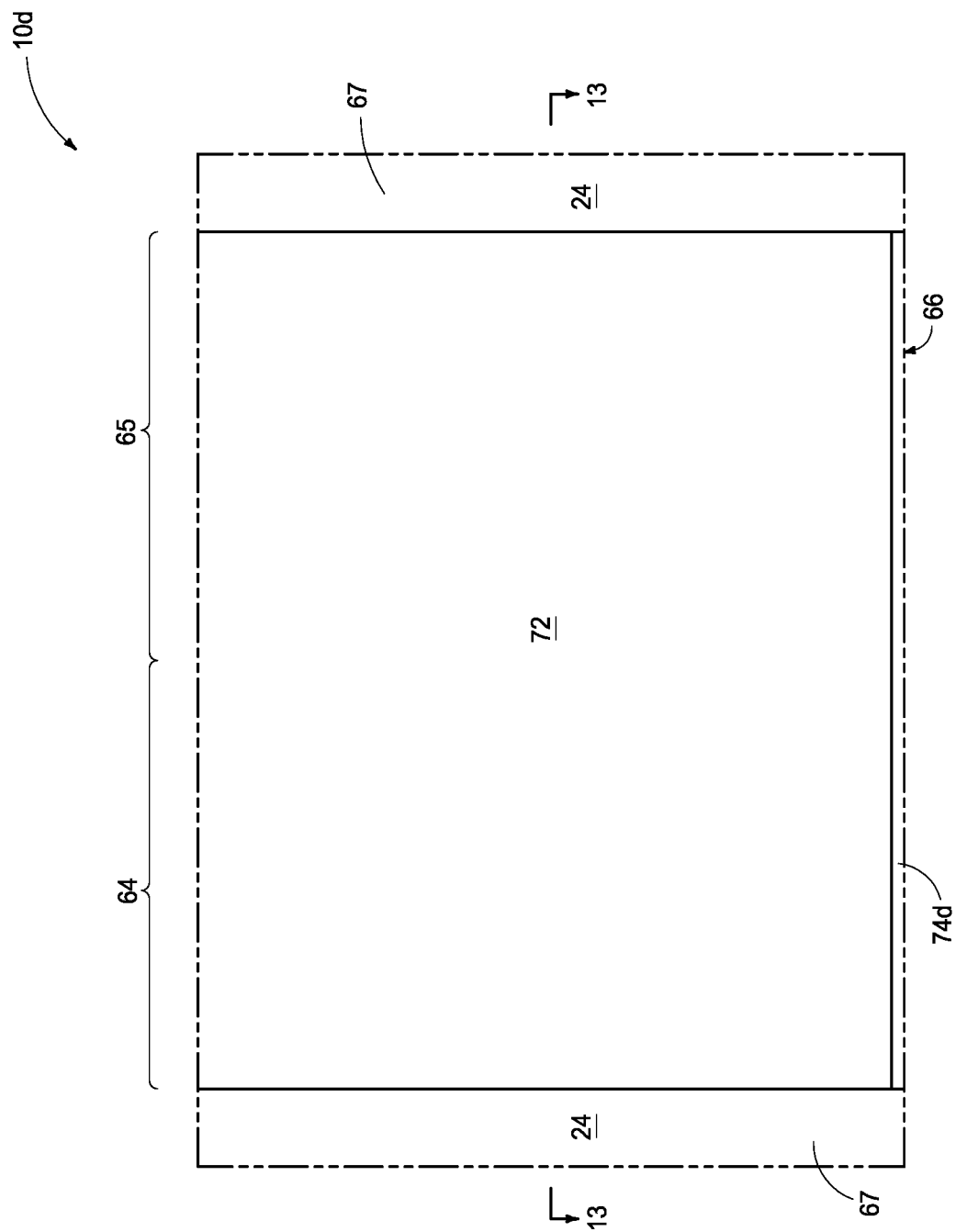

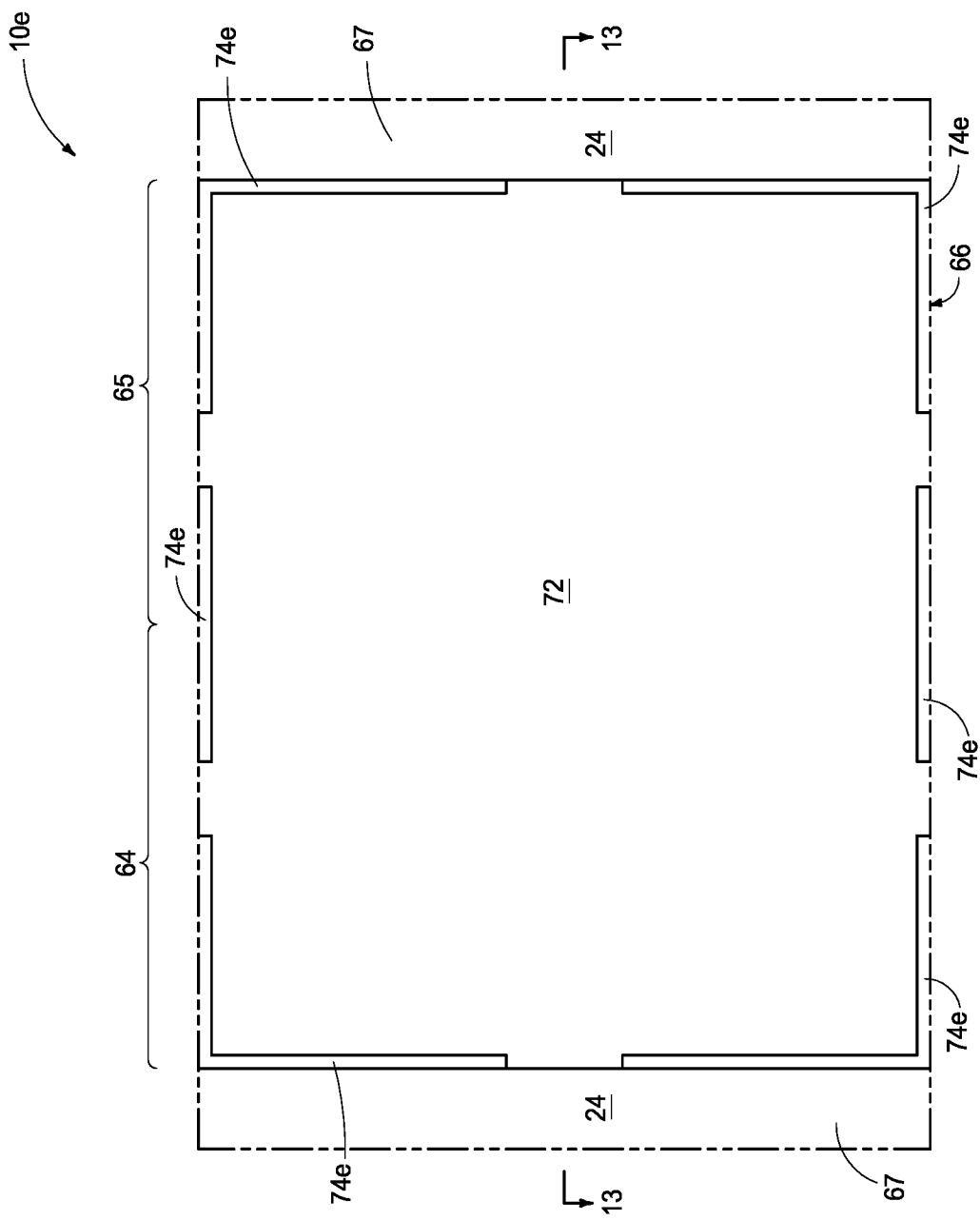

INTEGRATED CIRCUITRY, MEMORY ARRAYS COMPRISING STRINGS OF MEMORY CELLS, METHODS USED IN FORMING INTEGRATED CIRCUITRY, AND METHODS USED IN FORMING A MEMORY ARRAY COMPRISING STRINGS OF MEMORY CELLS

TECHNICAL FIELD

Embodiments disclosed herein pertain to integrated circuitry and to methods used in forming integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines, gatelines, or gate lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 28-37 are diagrammatic cross-sectional views of portions of substrates in process in accordance with some embodiments of the invention.

DETAILED DESCRIPTION OF EXAMPLE EMBODIMENTS

Figure 1:
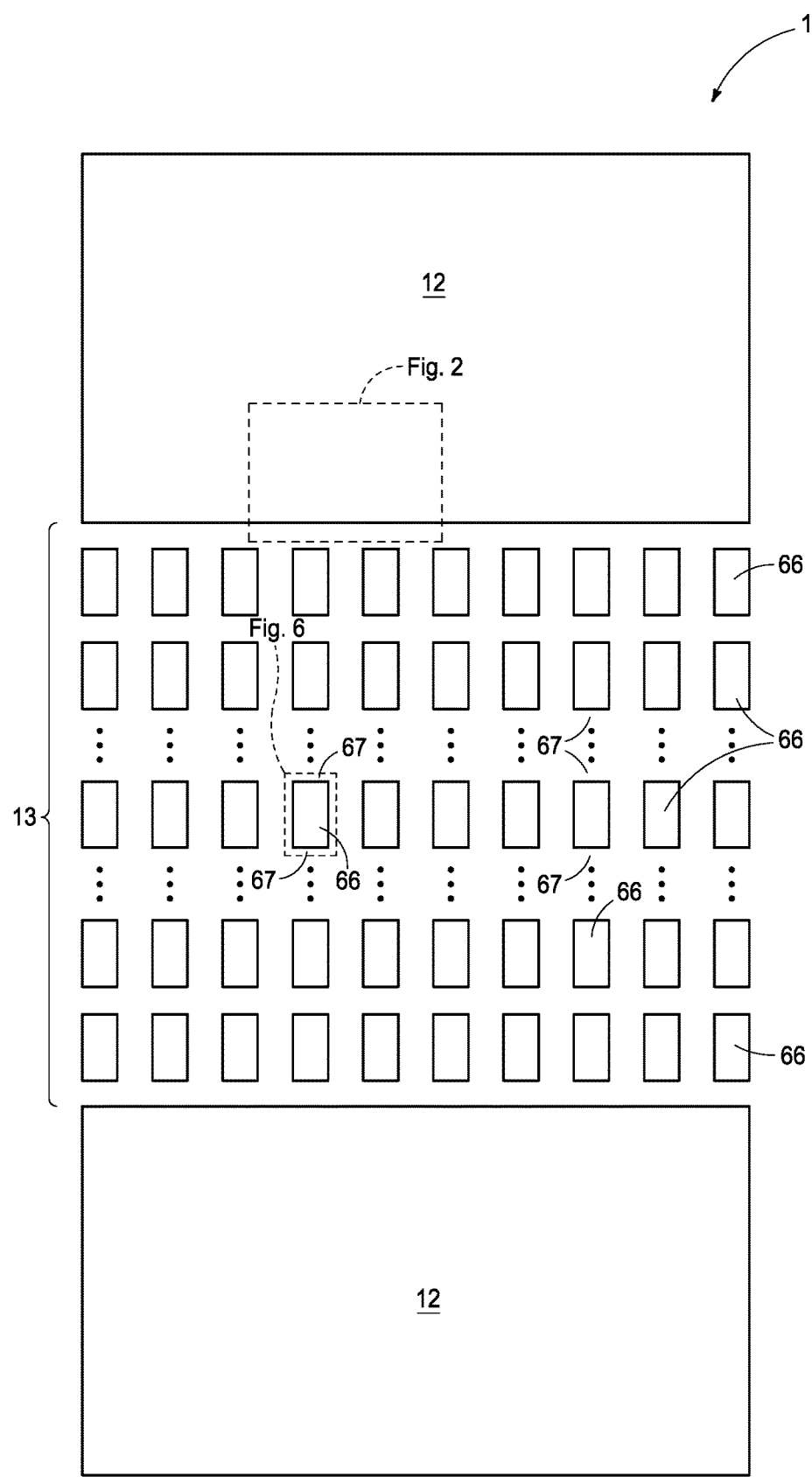
FIG. 1 is a diagrammatic view of a portion of a substrate in process in accordance with an embodiment of the invention.
Figure 2:
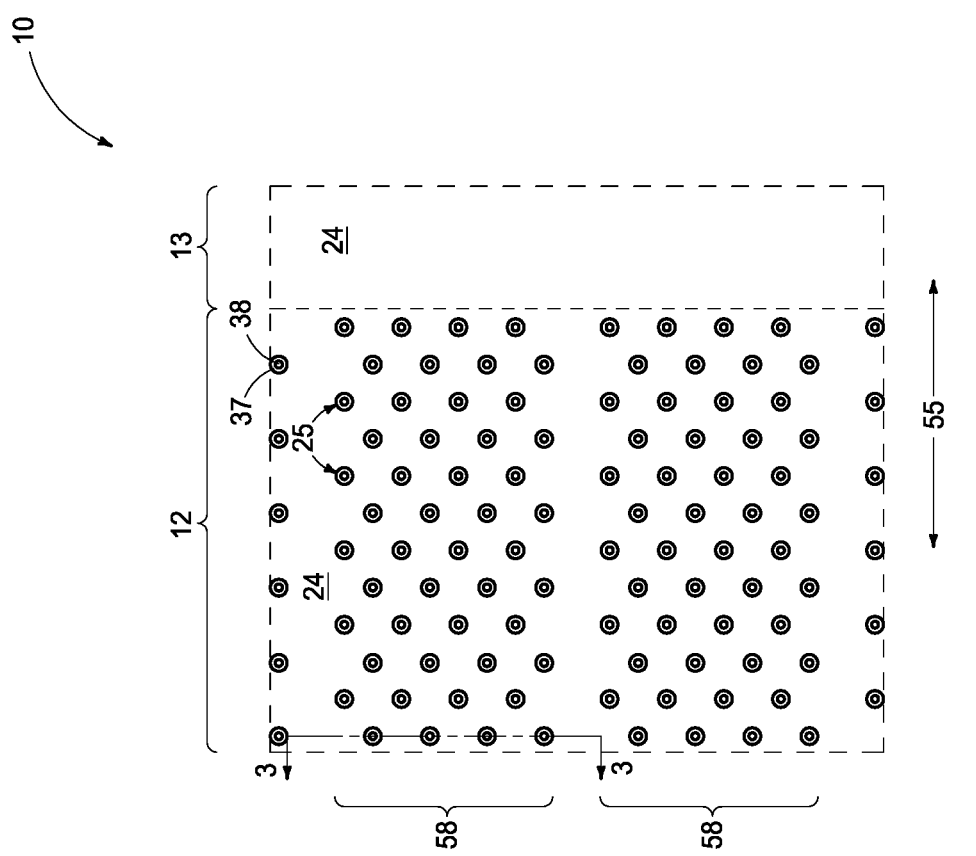
FIG. 2 is an enlarged diagrammatic section view of a portion of FIG. 1 and is taken through line 2-2 in FIG. 3.

Some aspects of the invention were motivated in overcoming problems associated with so-called "block-bending" (a block stack tipping/tilting sideways relative to its longitudinal orientation during fabrication), although the invention is not so limited.

Embodiments of the invention encompass methods used in forming integrated circuitry, for example memory circuitry, logic circuitry, or other existing or future-developed integrated circuitry. In one example, such integrated circuitry comprises a memory array such as an array of NAND or other memory cells that may have at least some peripheral control circuitry under the array (e.g., CMOS-under-array). Embodiments of the invention also encompass existing or future-developed integrated circuitry independent of method of manufacture, for example memory circuitry comprising a memory array (e.g., NAND architecture). First example method embodiments are described with reference to FIGS.

1-27 which may be considered as a "gate-last" or "replacement-gate" process in the forming of memory circuitry, and starting with FIGS. 1-5.

FIGS. 1-5 show a construction 10 having two memory-array regions 12 in which elevationally-extending strings of transistors and/or memory cells will be formed. A stair-step region 13 is between memory-array regions 12 and in which one or more stair-step structures have been or will be formed. Example construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Alternately or additionally, at least one of the depicted uppermost and lowest conductive tiers 22 may be a select gate tier. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial.

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 1-5 show one embodiment where charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual openings 25 followed by planarizing such back at least to a top surface of stack 18.

Channel material 36 has also been formed in channel openings 25 elevationally along insulative tiers 20 and conductive tiers 22, thus comprising individual operative channel-material strings 53 in channel openings 25. Channel-material strings 53 in one embodiment have memory-cell materials (e.g., 30, 32, and 34) there-along and with second-tier material (e.g., 24) being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

The above processing is but one example of forming channel-material strings 53 in a memory-array region 12. Alternate existing or future-developed techniques may be used and example channel-material strings 53 may be fabricated later in processing than as shown.

Figure 3:
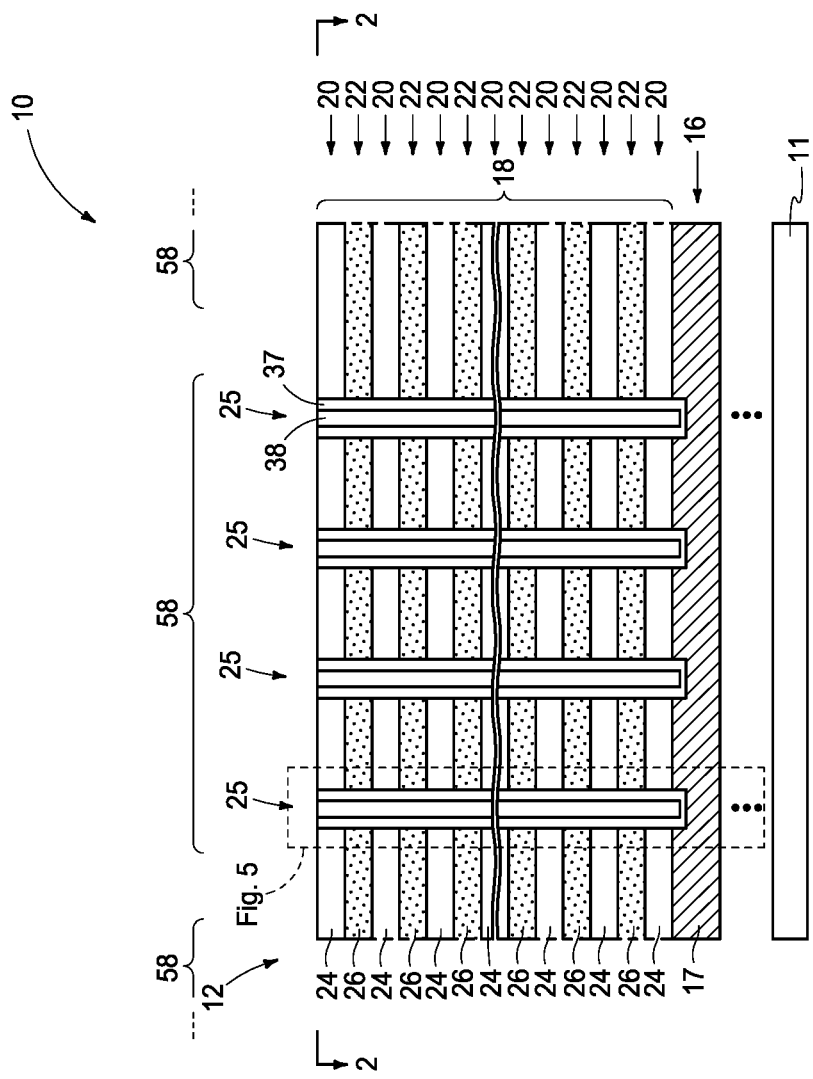
FIG. 3 is a diagrammatic section view taken through line 3-3 in FIG. 2.
Figure 4:
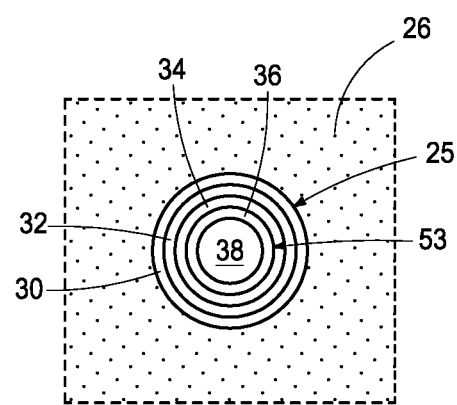
FIG. 4 is a section view taken through line 4-4 in FIG. 5.
Figure 5:
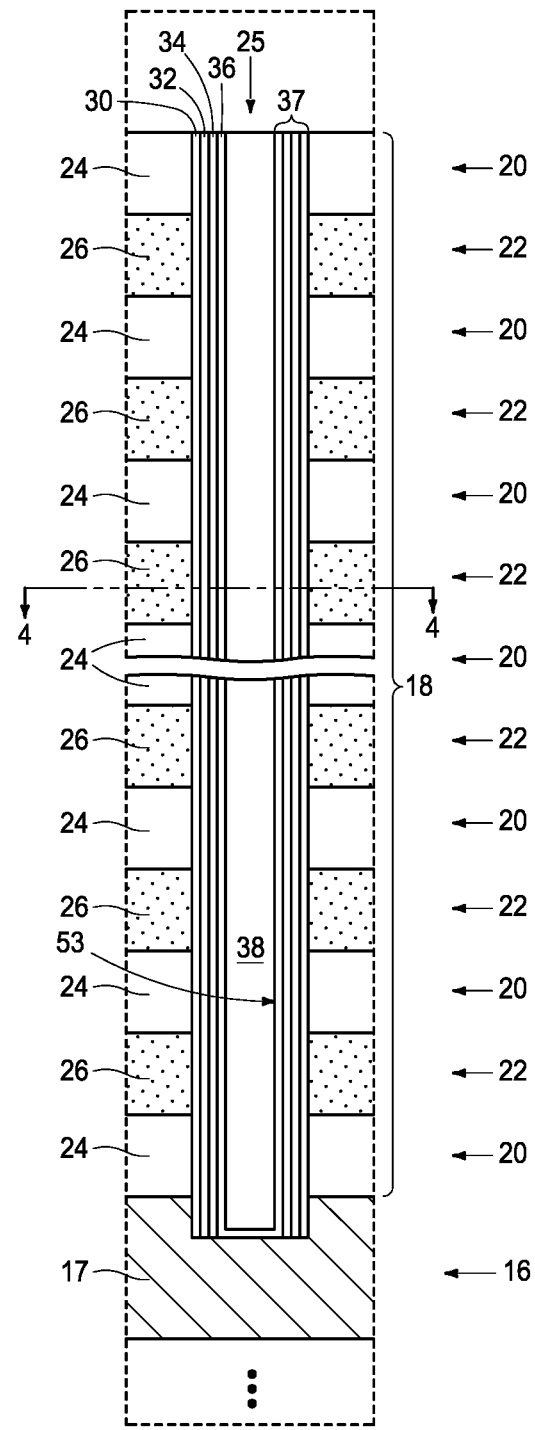
FIG. 5 is an enlarged view of a portion of FIG. 3.
Figure 6:
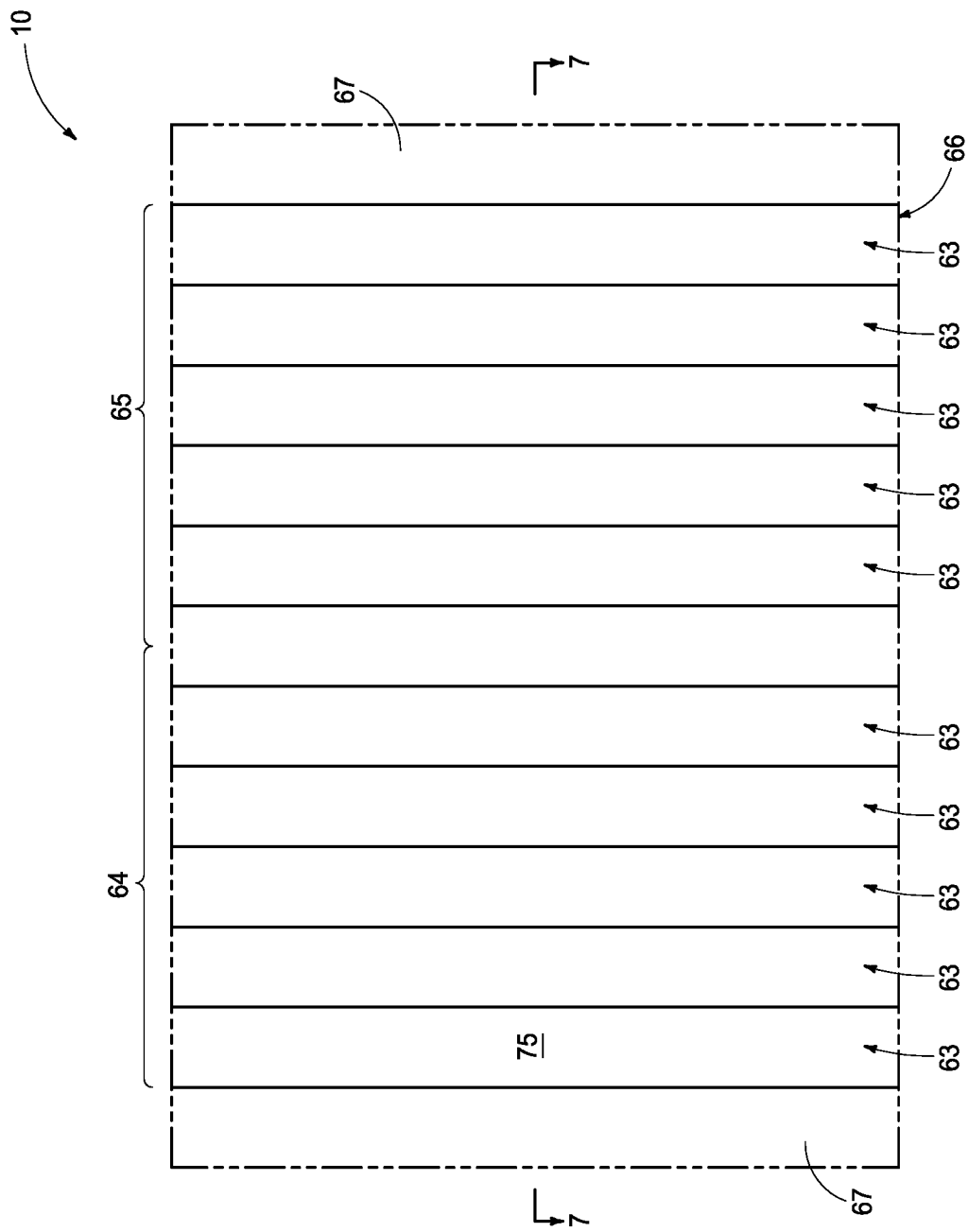
FIG. 6 is an enlarged view of a portion of FIG. 1.
Figure 7:
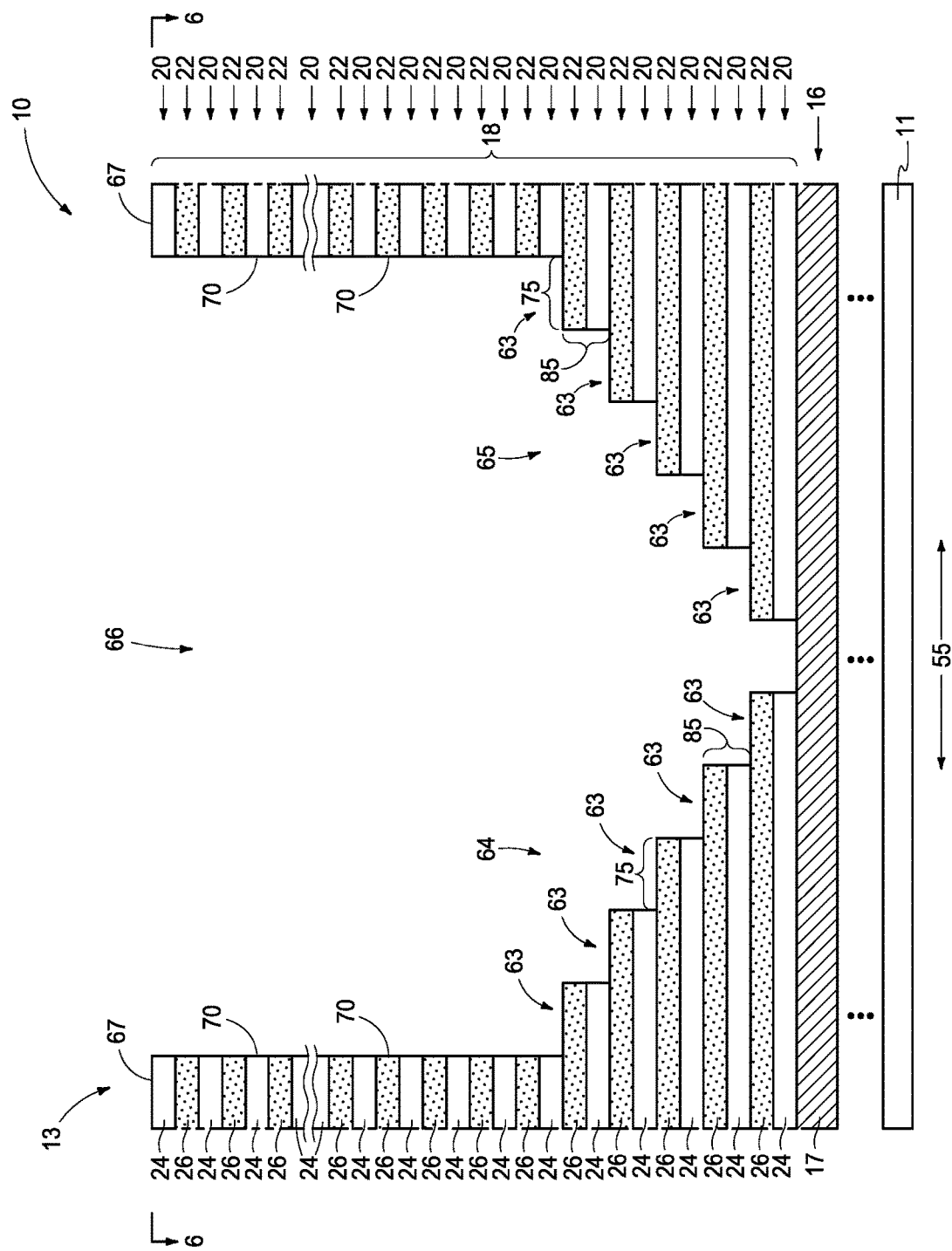
FIG. 7 is a diagrammatic section view taken through line 7-7 in FIG. 6.

Referring to FIGS. 1, 6, and 7, and in one embodiment, an array of multiple cavities 66 have been formed in stair-step region 13 and that individually comprise a stair-step structure as described below. Example cavities 66 are aligned longitudinally end-to-end in individual memory-block regions 58 and have a crest 67 between immediately-adjacent cavities 66. Alternately, only a single cavity may be in individual memory-block regions 58 (not shown). Nevertheless, method and structure embodiments include fabrication of and a resultant construction having only a single cavity 66 and the discussion largely proceeds with respect to a single cavity 66. Cavities 66 are shown as being rectangular in horizontal cross-section, although other shape(s) may be used and all need not be of the same shape relative one another. For brevity, less tiers 20 and 22 are shown in FIGS. 3 and 5 as compared to FIG. 7, with more tiers 20 and 22 being shown in FIG. 7 for clarity and better emphasis of depth of cavities 66.

Cavities 66 individually comprise a stair-step structure 64, for example that has steps 63 that individually comprise a tread 75 and a riser 85. Example stair-step structure 64 in the example "gate-last" method is circuit-inoperative but may comprise an operative stair-step structure in a finished-circuitry construction. An "operative stair-step structure" is circuit-operative having at least some conductive step thereof that electrically couples with and between a) an electronic component in memory-array region 12, such as a transistor and/or memory cell, and b) an electronic component outside of memory-array region 12. Stair-step structure 64 may be formed by any existing or later-developed method(s). As one such example, a masking material (e.g., a photo-imagable material such as photoresist) may be formed atop stack 18 and an opening formed there-through. Then, the masking material may be used as a mask while etching (e.g., anisotropically) through the opening to extend such opening into at least two outermost two tiers 20, 22. The resultant construction may then be subjected to a successive alternating series of lateral-trimming etches of the masking material followed by etching deeper into stack 18, two-tiers 20, 22 at a time, using the trimmed masking material having a successively widened opening as a mask. Such an example may result in the forming of stair-step structure 64 into stack 18 that comprises vertically alternating tiers 20, 22 of different composition materials 24, 26, and in the forming of another stair-step structure 65 opposite and facing stair-step structure 64 (e.g., in mirror image and as shown). Such opposite stair-step structure 65 may be a dummy stair-step structure in a finished circuitry construction. A "dummy stair-step structure" is circuit-inoperative having steps thereof in which no current flows in conductive material of the steps and which may be a circuit-inoperable dead end that is not part of a current flow path of a circuit even if extending to or from an electronic component. Operative vs. inoperative relative to stair-step structures 64 and 65 may of course be reversed. Multiple operative stair-step structures and multiple dummy stair-step structures may be formed in multiple cavities 66, for example longitudinally end-to-end as shown and to different depths within stack 18. Pairs of opposing mirror-image operative and dummy stair-step structures may be considered as defining a stadium (e.g., a vertically recessed portion having opposing flights of stairs as shown). Alternately, only a single stair-step structure 64 or 65 may be formed (not shown) in one or more individual cavities 66. Regardless, cavities 66 may be formed before or after forming channel-material strings 53. Cavities 66 may be considered as having sidewalls 70 and 85 (where risers 85 are present such effectively are part of the sidewalls of cavities 66).

Figure 8:
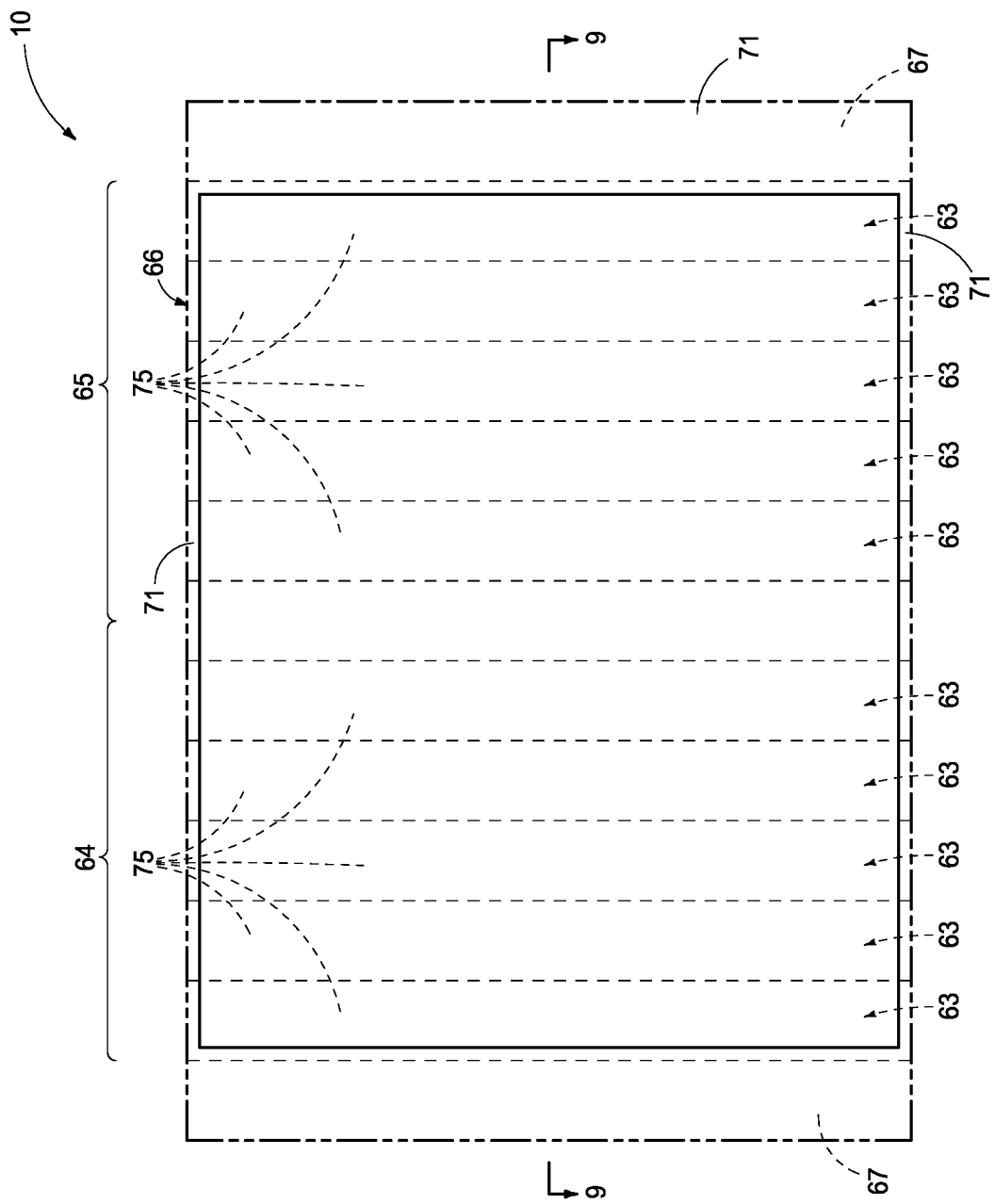
FIGS. 8-27 are diagrammatic sequential sectional, expanded, enlarged, and/or partial views of the construction of FIGS. 1-3, or portions thereof, in process in accordance with some embodiments of the invention.
Figure 9:
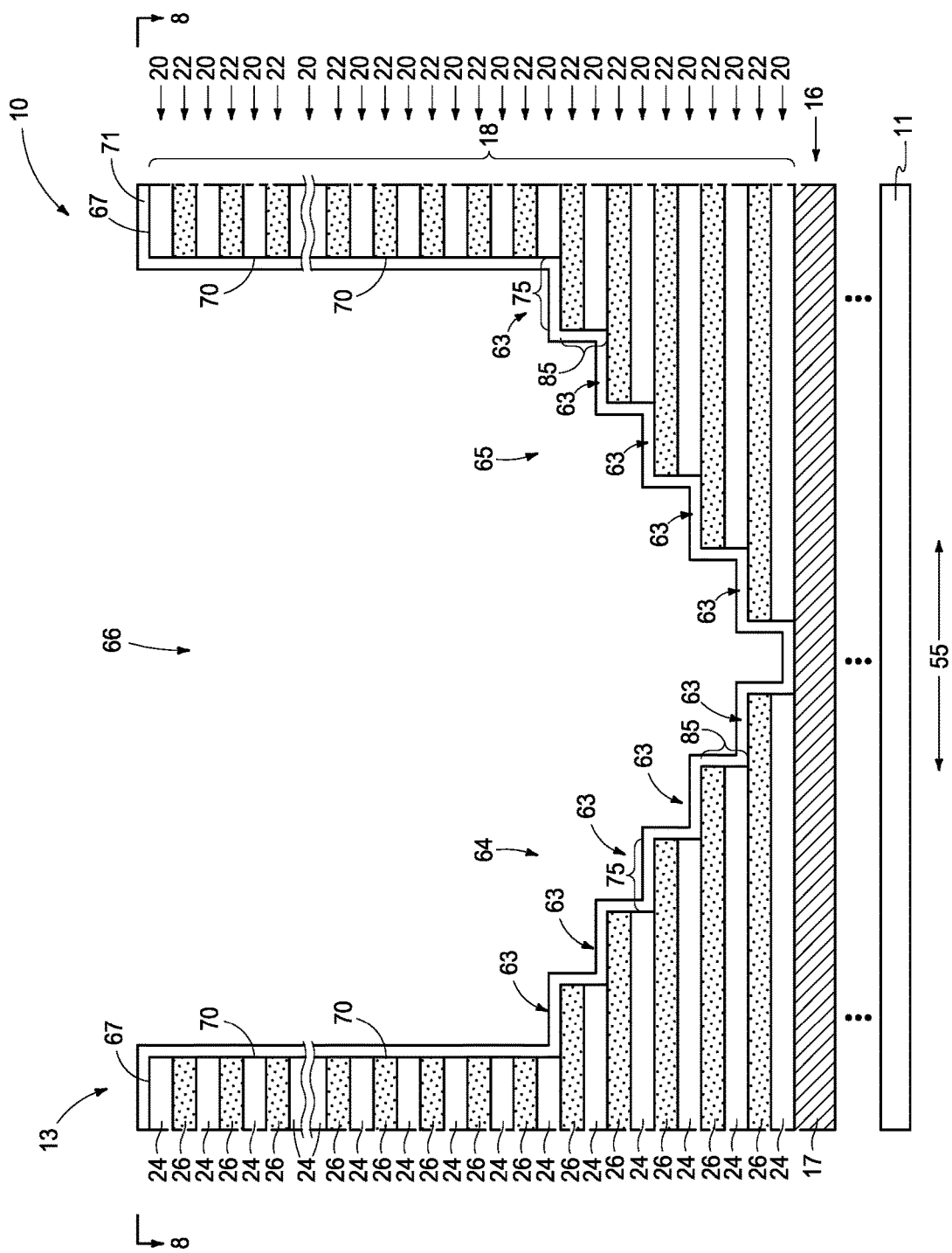

Referring to FIGS. 8 and 9 at least a portion of sidewalls 70/85 of cavity 66 have been lined with sacrificial material 71. A non-sacrificial thin dielectric liner (e.g., silicon dioxide and not shown) may be formed over sidewalls 70/85 and treads 75 prior to forming sacrificial material 71. FIGS. 8 and 9 show an example embodiment where sacrificial material 71 is laterally over all of cavity sidewalls 70/85. Other embodiments are described below where sacrificial material 71 is laterally over less-than-all of cavity sidewalls 70/85. FIGS. 8 and 9 also show an embodiment where sacrificial material 71 is circumferentially about all of at least an uppermost portion of the cavity sidewalls. Further, FIGS. 8 and 9 show an example embodiment where sacrificial material 71 is formed atop treads 75 and aside risers 85. Alternate example embodiments not having one or more of these latter features are described below. Sacrificial material 71 may be 100% sacrificial and, if so, its conductive, insulative, or semiconductive properties may be immaterial. If any of sacrificial material 71 remains in a finished construction, such ideally is insulative.

Figure 10:
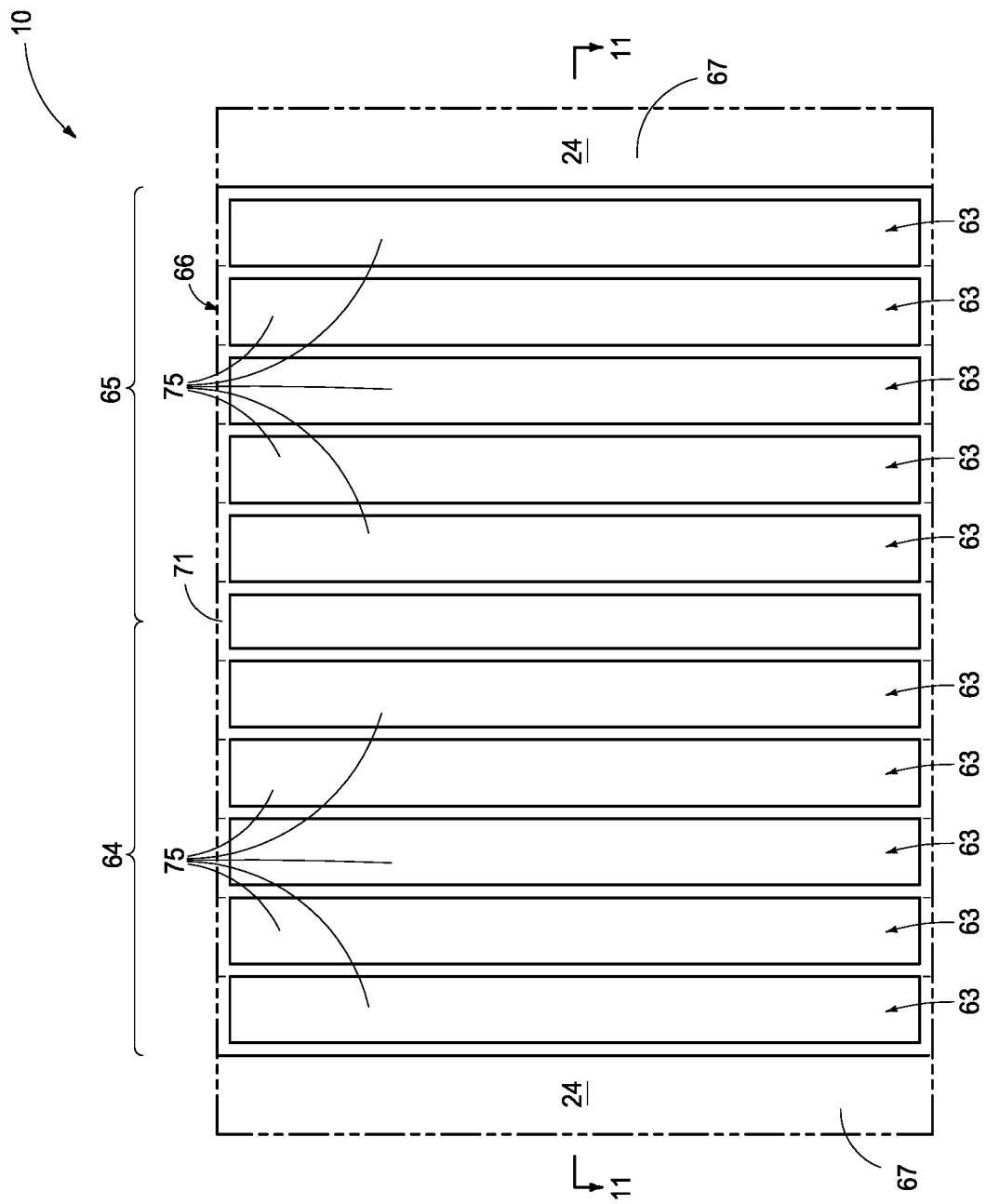
Figure 11:
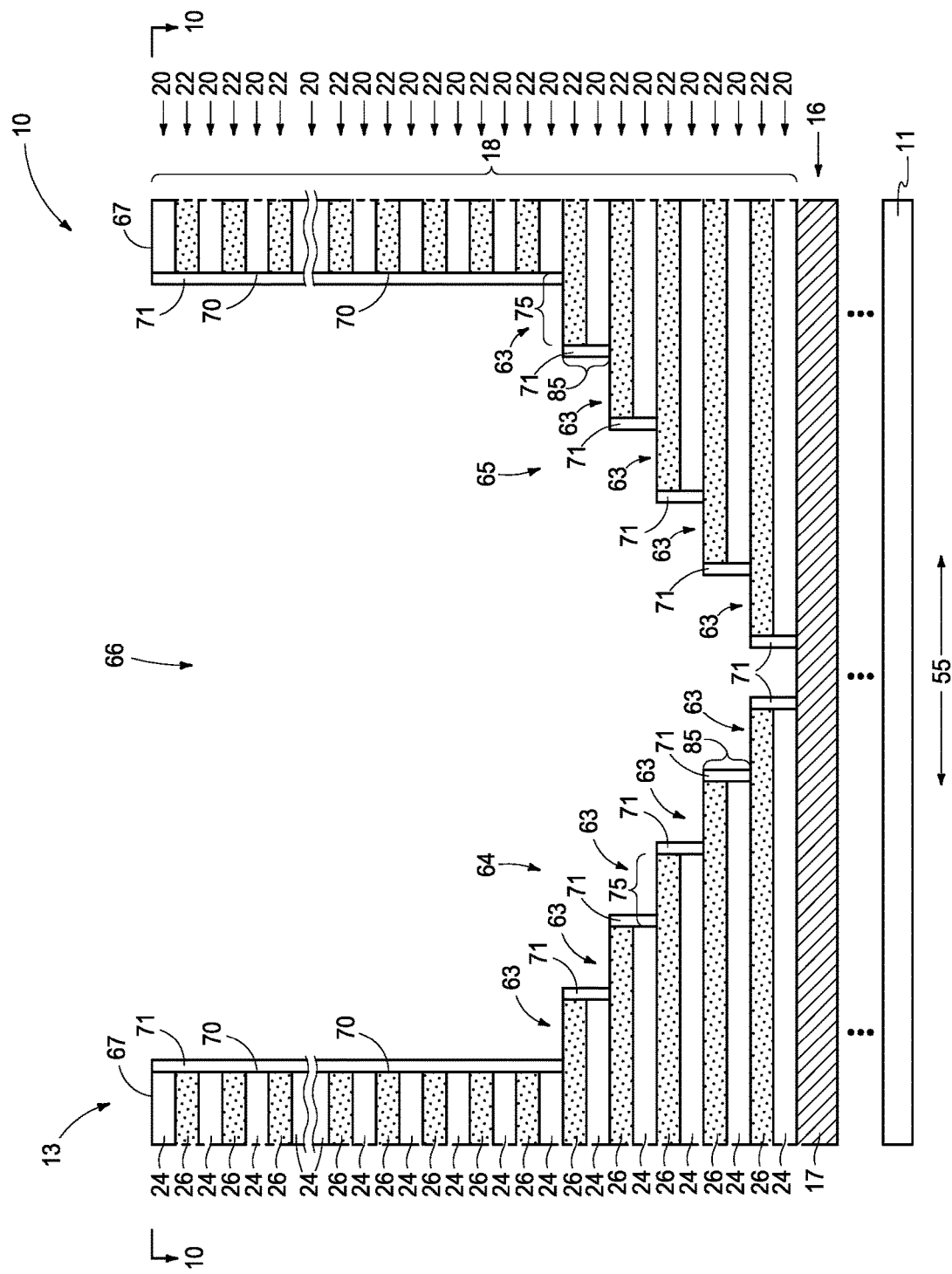

Referring to FIGS. 10 and 11, and in one embodiment, sacrificial material 71 has been anisotropically etched to substantially remove it from being over horizontal surfaces, and in one embodiment thereby removing sacrificial material 71 from being atop treads 75 except where immediately-aside risers 85. Alternately, as an example, sacrificial material 71 may be isotropically etched in a timed manner and regardless sacrificial material 71 may be atop example uppermost tier 20/crest 67 (not shown).

Figure 12:
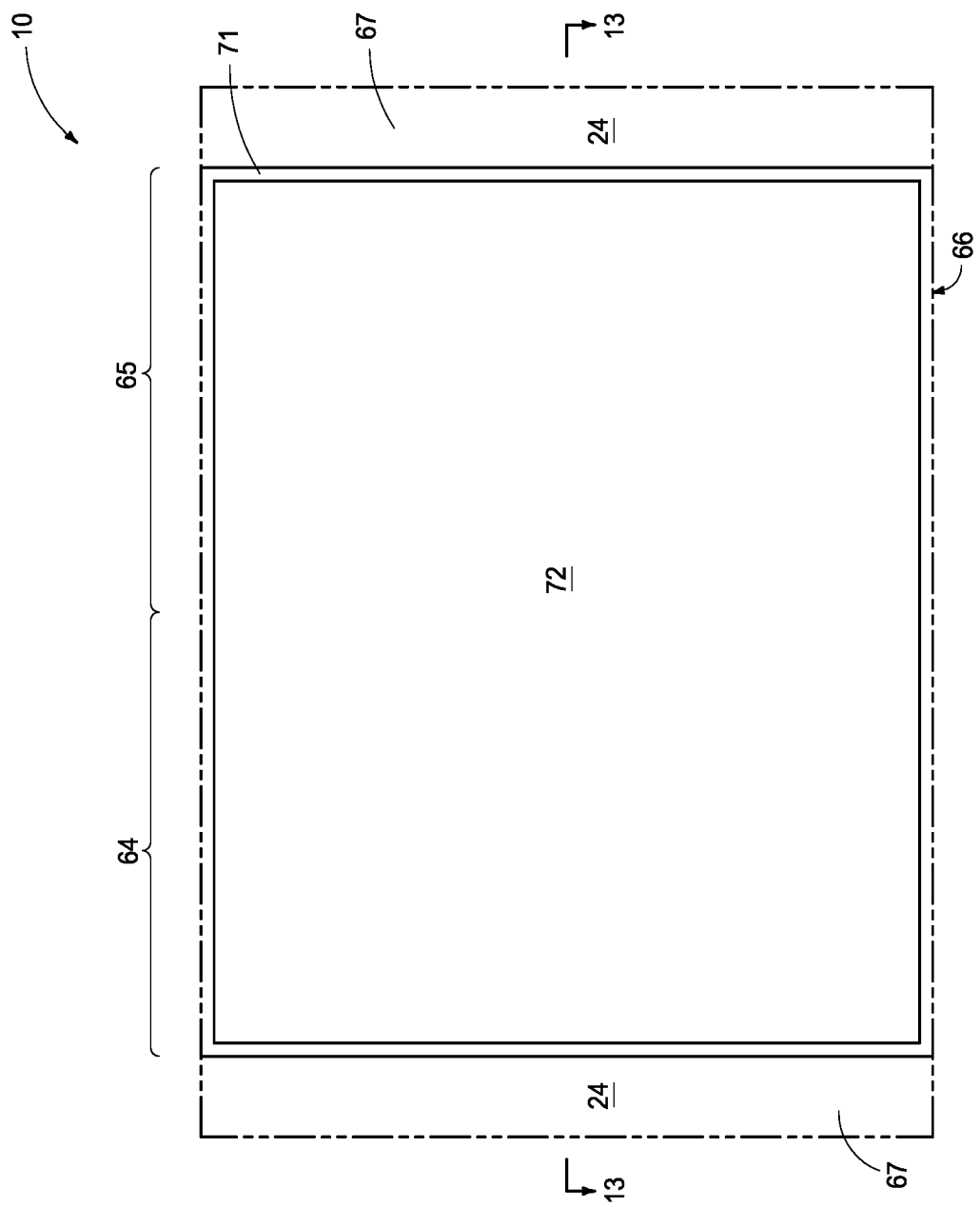
Figure 13:
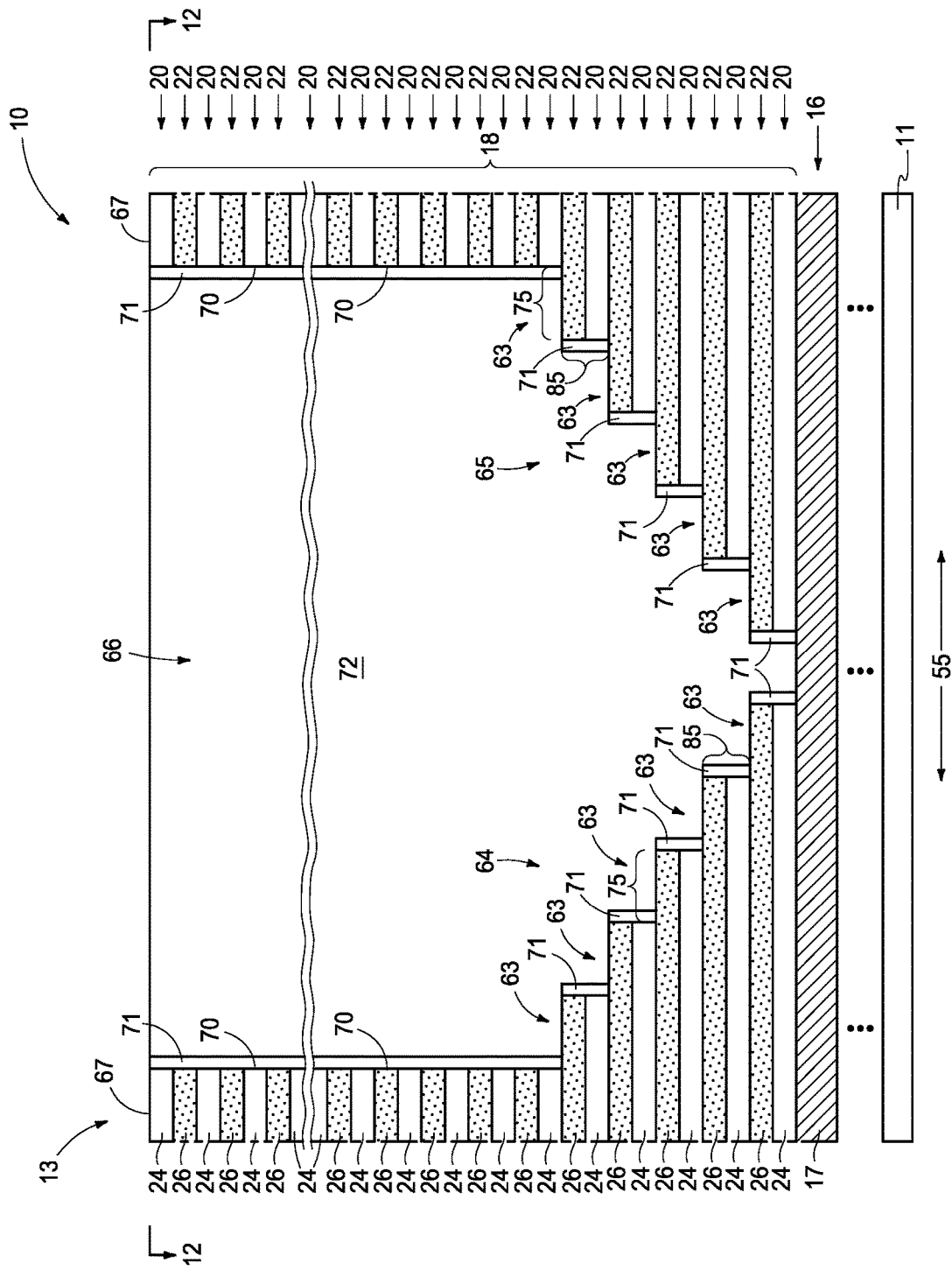

Referring to FIGS. 12 and 13, insulative material 72 has been formed in cavity 66 radially inward of sacrificial material 71. Insulative material 72 may be deposited to initially overfill cavity 66 and then planarized back (e.g., by chemical mechanical polishing). Any existing or future-developed insulative material may be used. Some aspects of the invention were motivated in overcoming problems associated with achieving good dense fill of insulative material in deep cavities 66. Spin-on-dielectrics are one proposed classification of materials and in one embodiment the forming of insulative material 72 comprises flowing spin-on-dielectric into cavity 66. In such embodiment, the liquid spin-on-dielectric will subsequently be fully densified and where such may be transformed to a different insulative composition from composition in its initially liquid state. In one embodiment in accordance with the invention, the spin-on-dielectric is partially and only partially densified at this point in the example method (e.g., immediately after its initial deposition). The artisan is capable of selecting suitable conditions to achieve partial densification (e.g., lower temperature and/or lower time of exposure to steam or other ambient). The partial densifying in one embodiment is at least 10% of the fully-densifying density of material 72, in one embodiment is no more than 75% of the fully-densifying density, in one embodiment is 10% to 75% of the fully-densifying density, and in one embodiment is 33% to 60% of the fully-densifying density. For example, and by way of example only, an example finished insulative material 72 resulting from flowing a certain spin-on-dielectric into cavity 66 is silicon dioxide having a fully densified density characterized by an elastic modulus of 80 to 90 gigapascals. In a partially densified state after its initial formation and at this point in processing, such elastic modulus may be 10 to 60 gigapascals, with 30 to 45 gigapascals being ideal.

Sacrificial material 71 is ideally of any suitable composition that may be removed (e.g., by etching) selectively relative to insulative material 72. Some examples are polysilicon, SiGe, aluminum oxide, magnesium oxide, silicon nitride, and carbon, and particularly where insulative material 72 is silicon dioxide.

Figure 14:
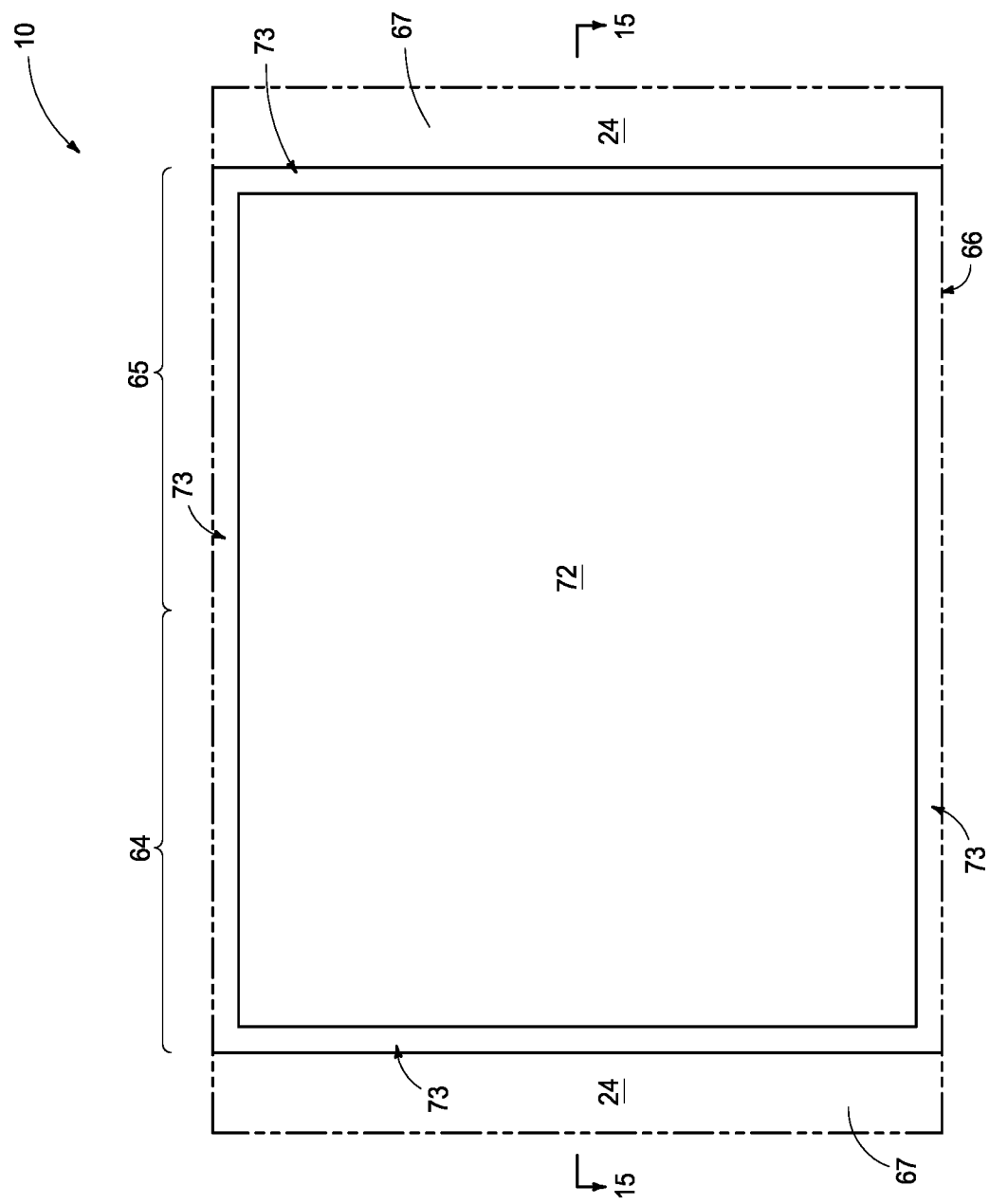
Figure 15:
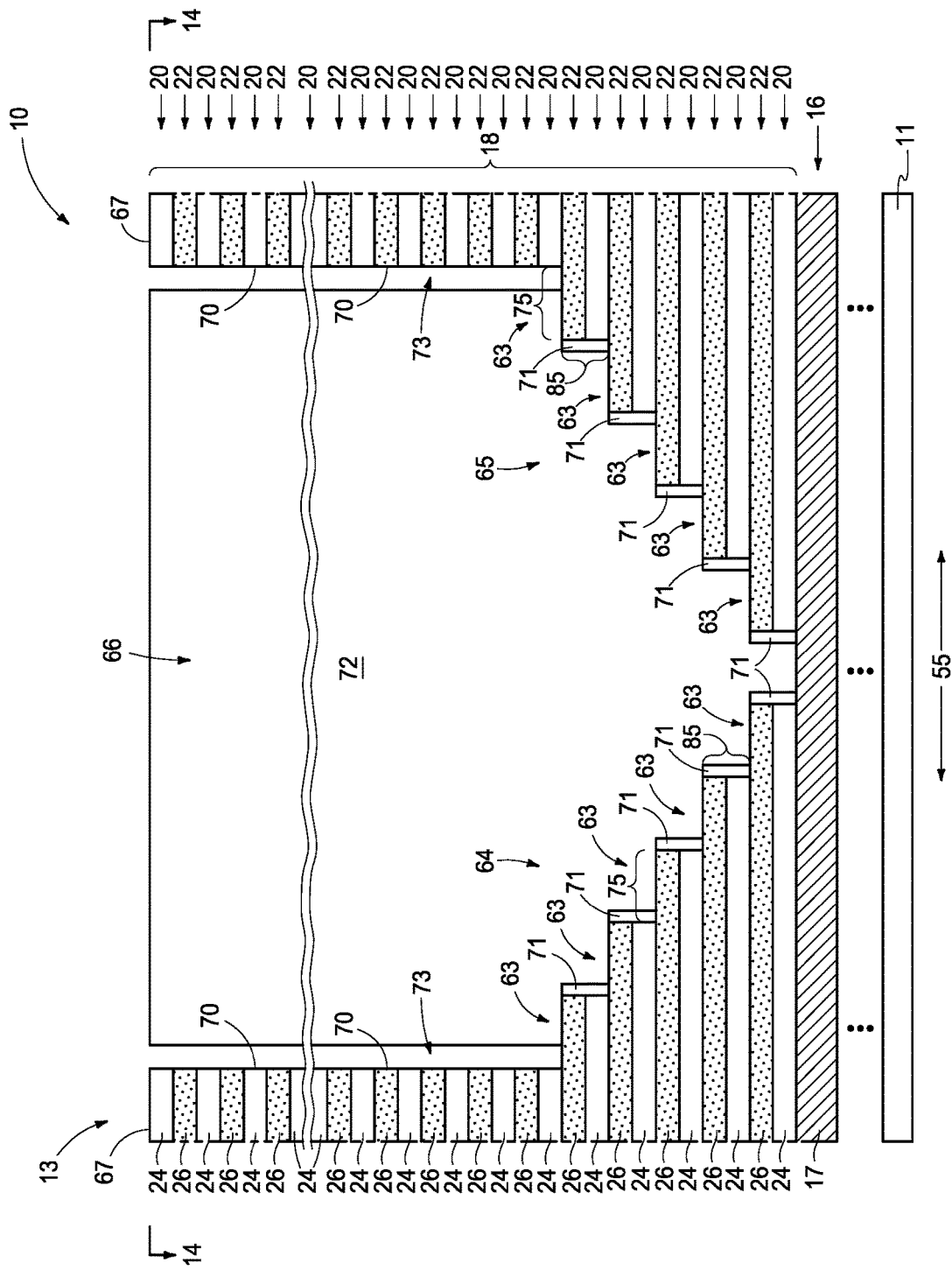

Referring to FIGS. 14 and 15, at least some of sacrificial material 71 has been removed (e.g., by isotropic etching it selectively relative to insulative material 72) from being between cavity sidewalls 70 and insulative material 72, thus forming a void space 73 there-between. The artisan is capable of selecting any suitable existing or future-developed etching chemistry that will etch a given sacrificial material 71 selectively relative to a given insulative material 72.

In one embodiment where for example insulative material 72 at least initially comprises spin-on-dielectric (regardless of whether having been partially densified), a full densification thereof is ideally now conducted. Such is intended to be exemplified in FIGS. 14 and 15 by example void space 73 shown as being twice as wide as thickness (width) of sacrificial material 71 in FIGS. 8-13. Insulative material 72 may also have reduced vertical thickness (not shown) resulting from full densification. Regardless, full densification of a spin-on-dielectric typically comprises gas emission there-from that in the absence of void space 73 would only be able escape from the top of insulative material 72. Such can lead to formation of undesired cracks in and delamination of insulative material 72 and formation of undesired void spaced in the finished construction as insulative material 72 would be caused to laterally shrink as part of the full densification. Here, in one embodiment, gas emission from insulative material 72 during final densification allows gas to flow into the depicted void space 73 as well as from the top of insulative material 72, thus perhaps achieving a more uniform, stress-free, and crack-free insulative material 72. In one embodiment and as shown, sacrificial material 71 where between one of cavity sidewalls 70/85 and insulative material 72 is of constant thickness from its top to its bottom at start of the act of removing sacrificial material 71 (FIG. 13).

Figure 16:
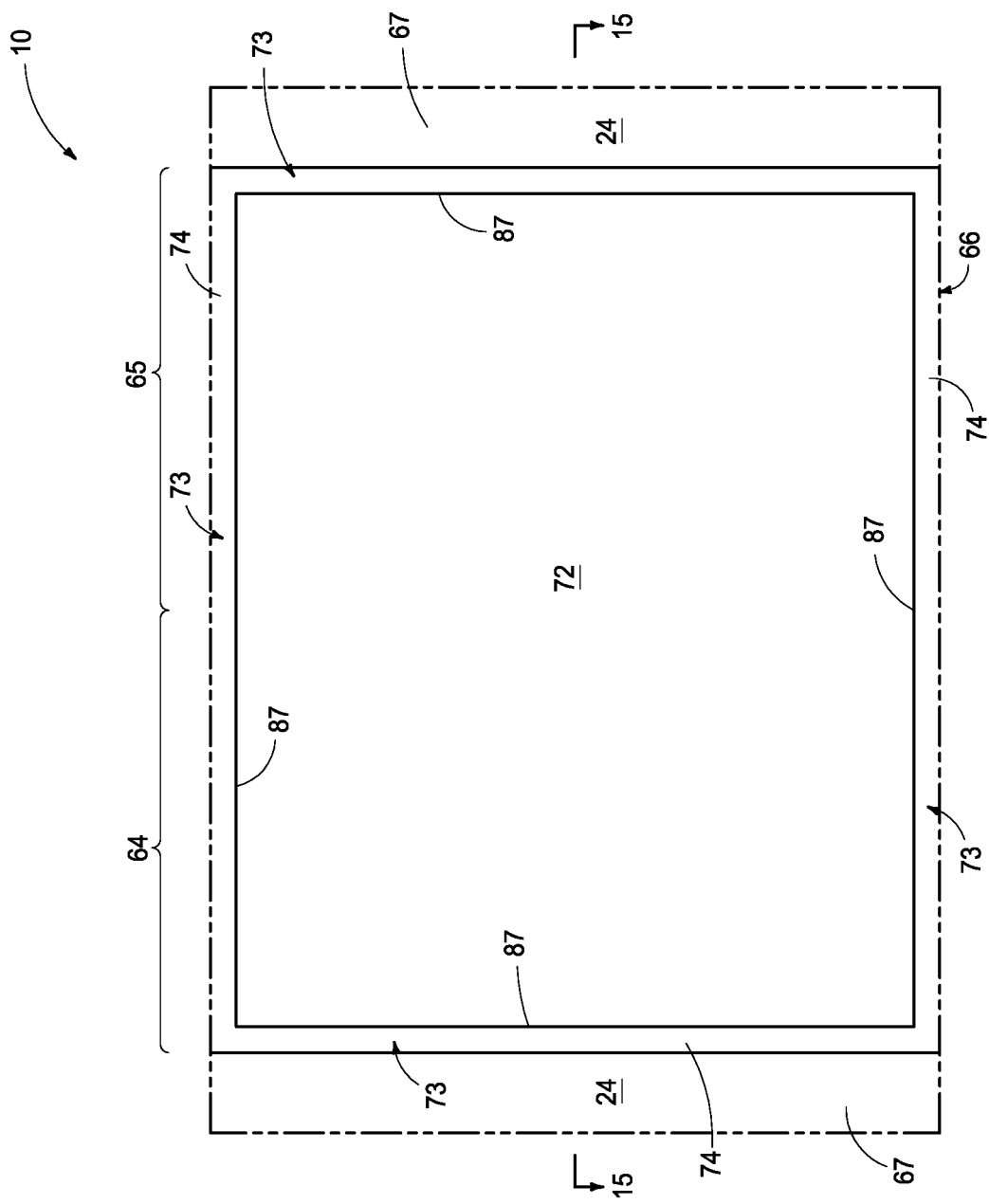
Figure 17:
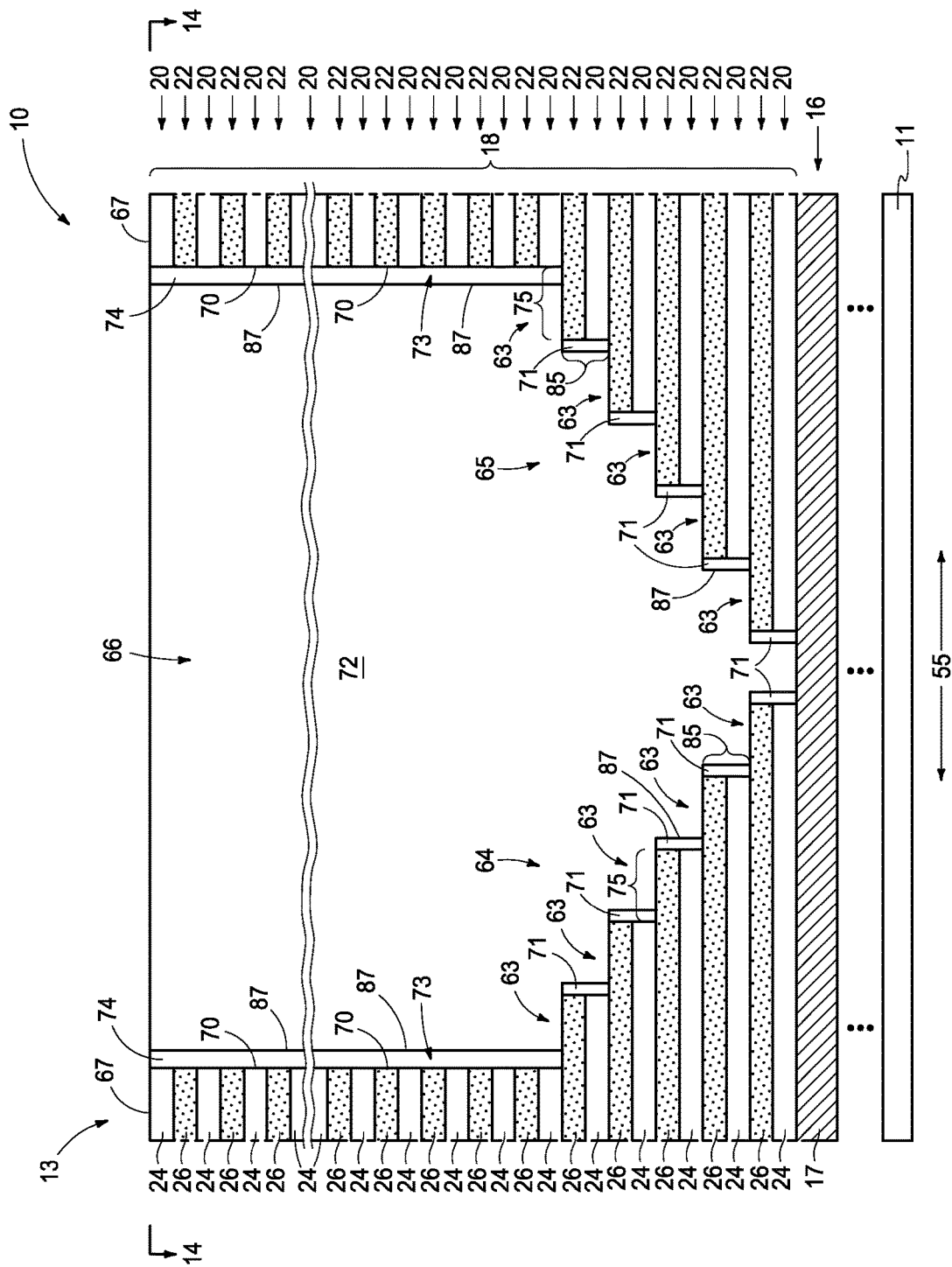
Figure 18:
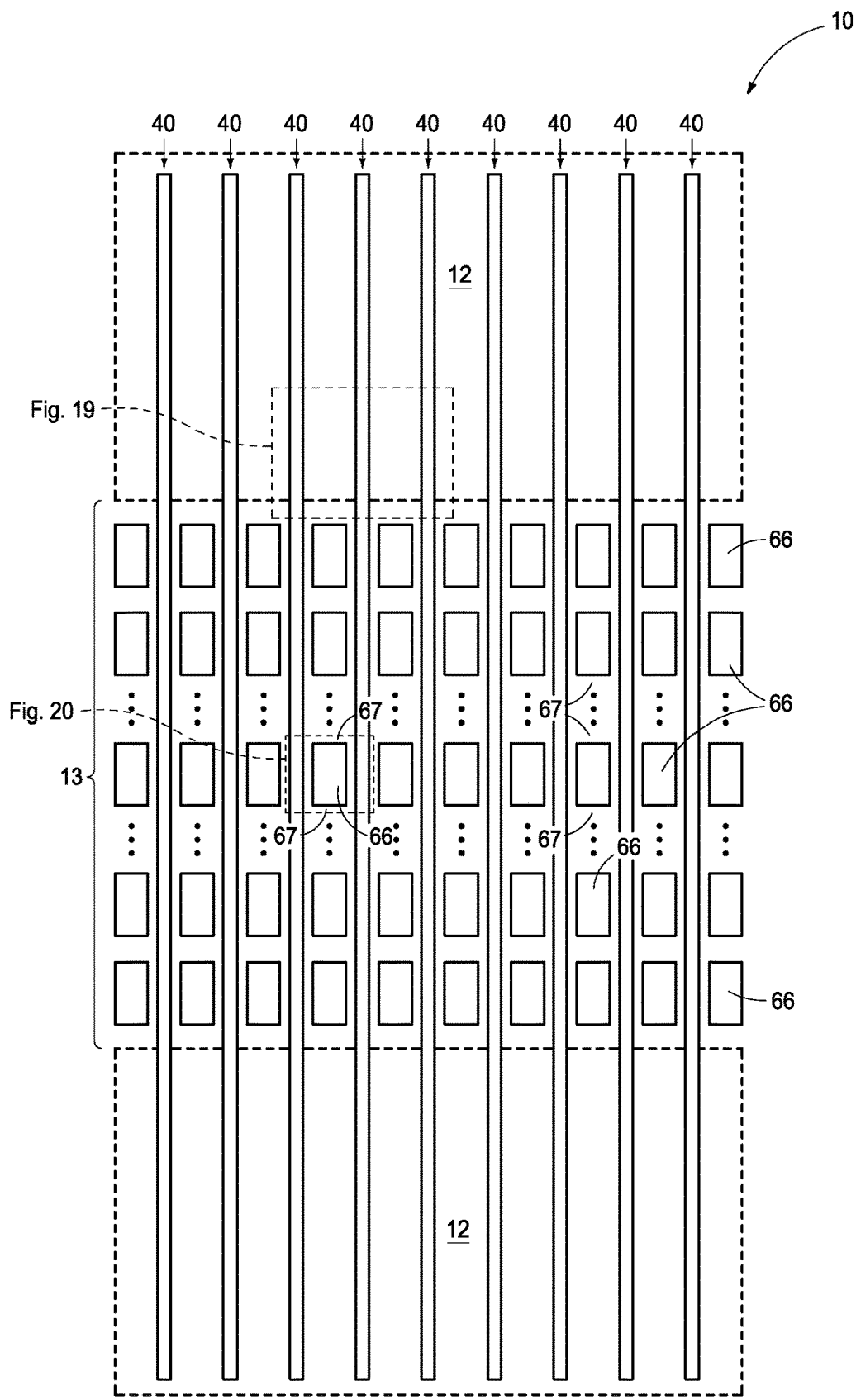
Figure 19:
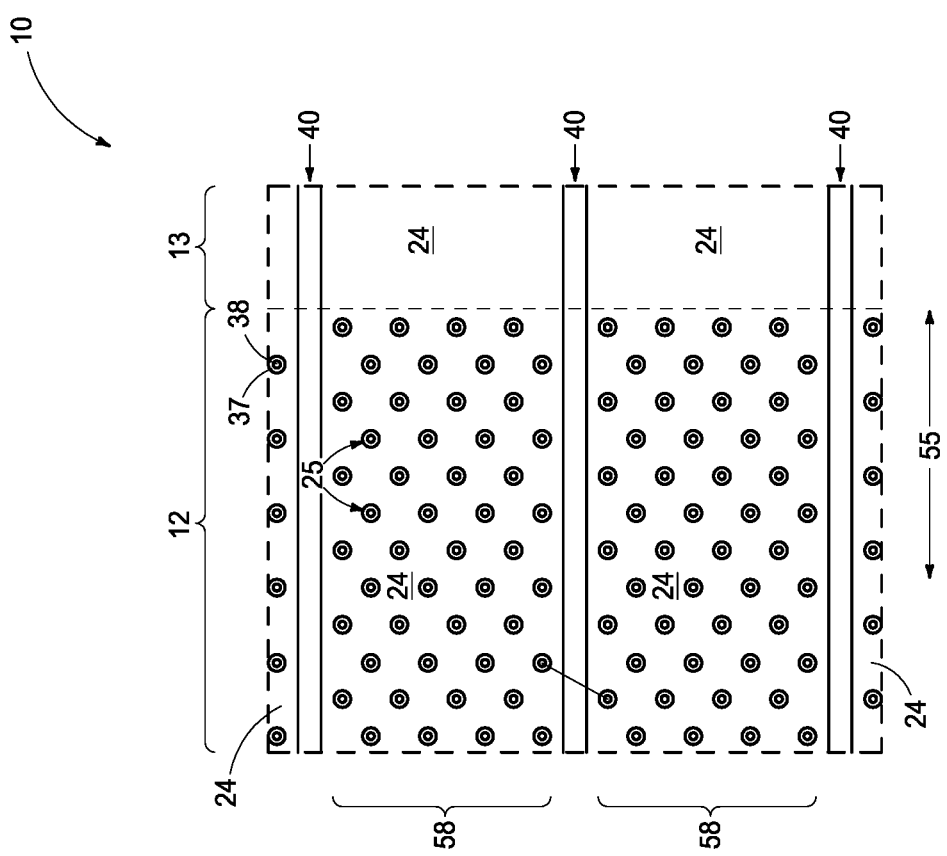
Figure 20:
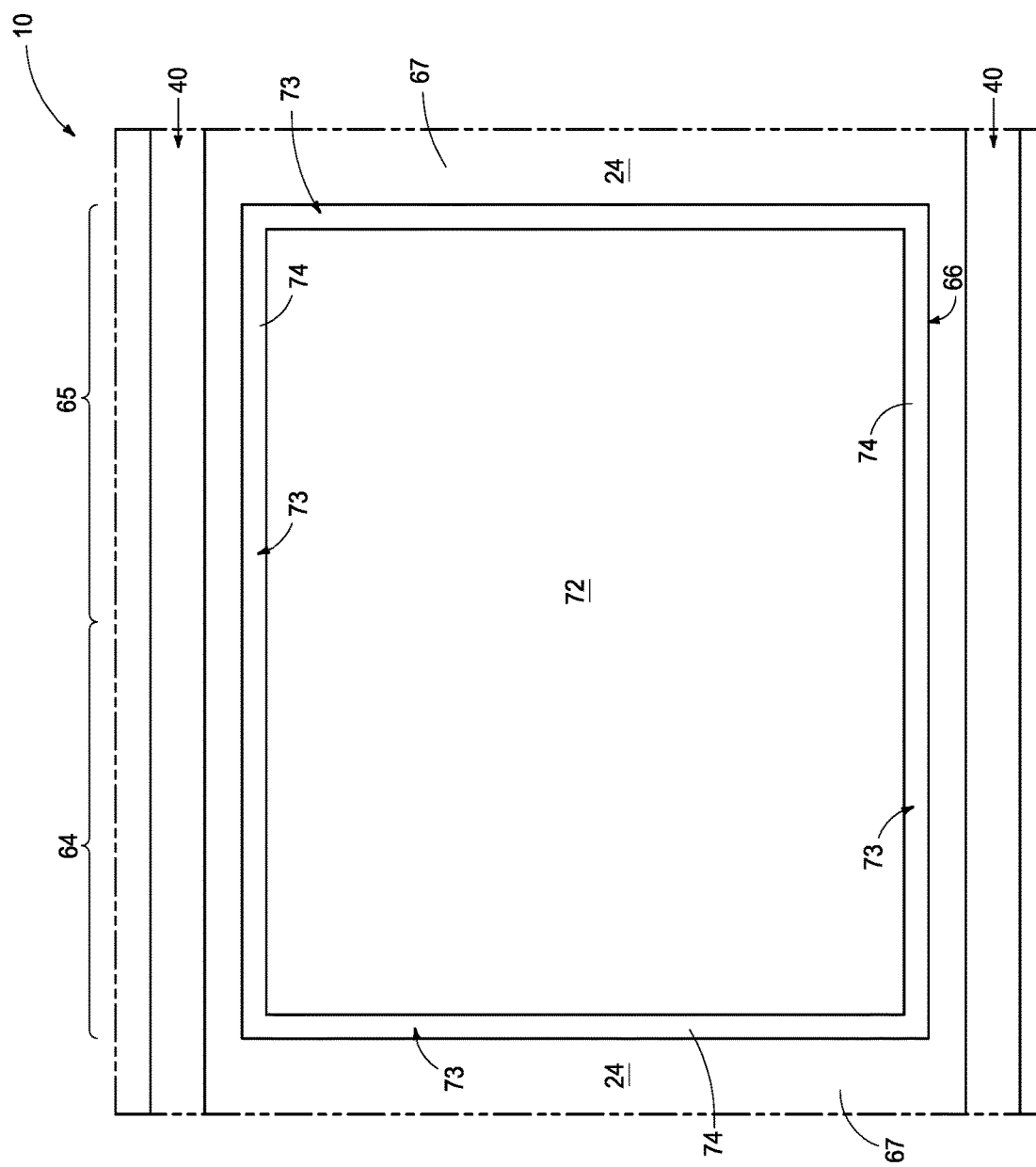
Figure 21:
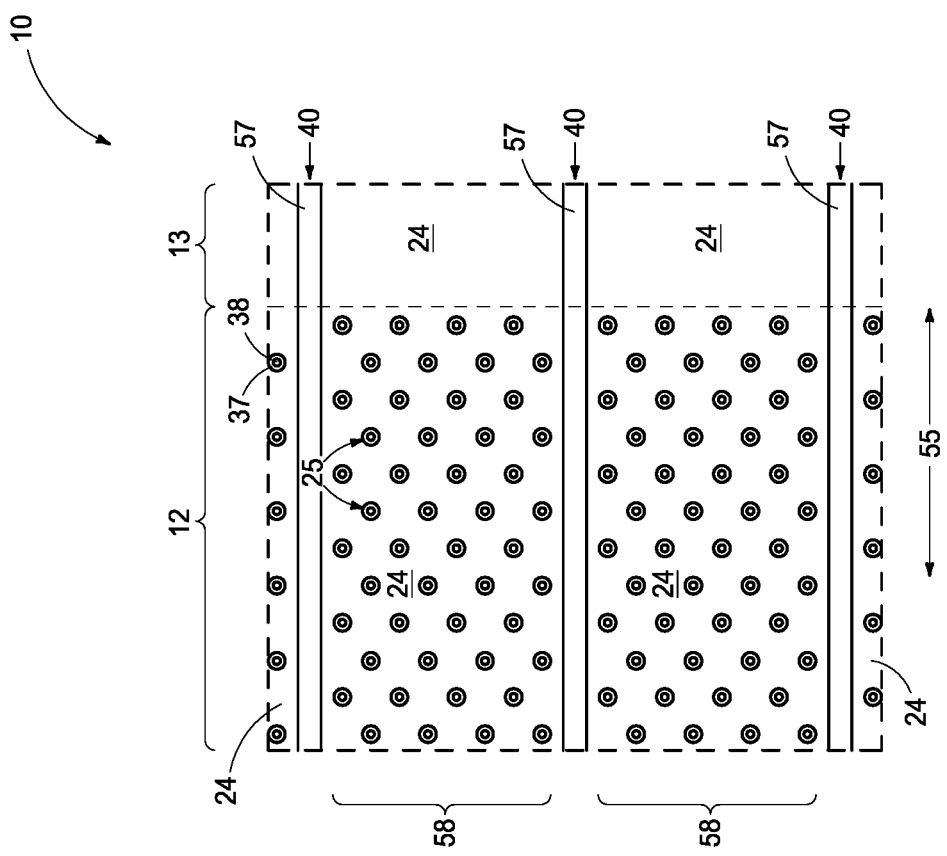
Figure 22:
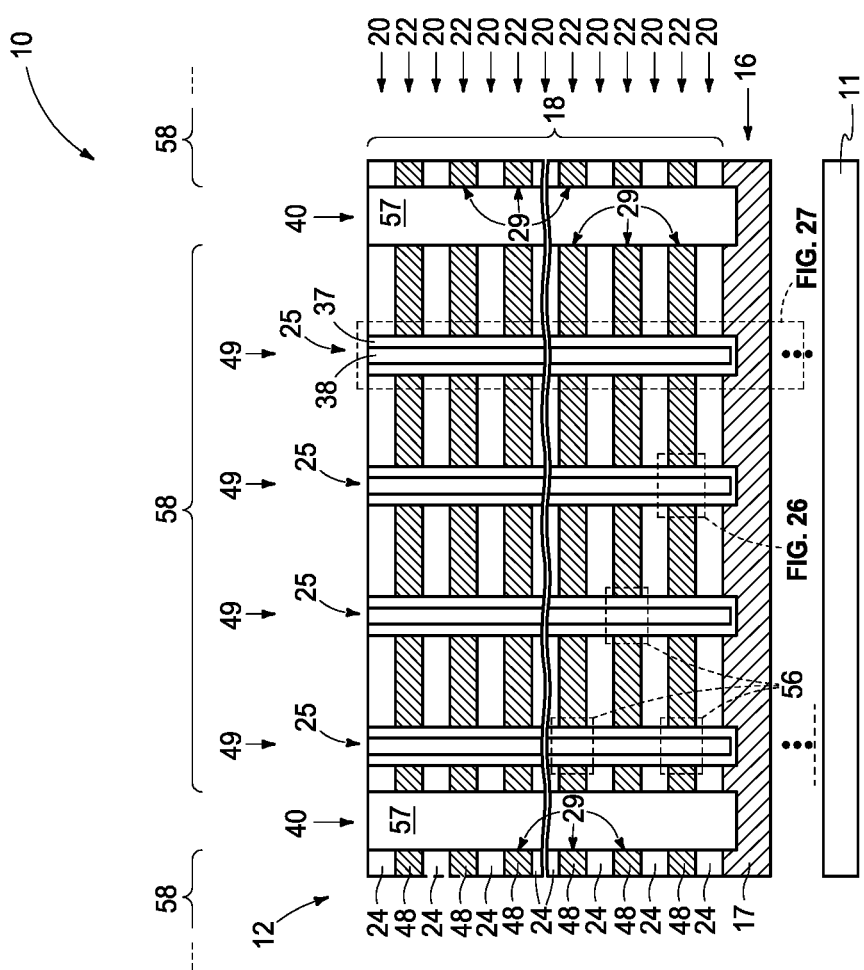
Figure 23:
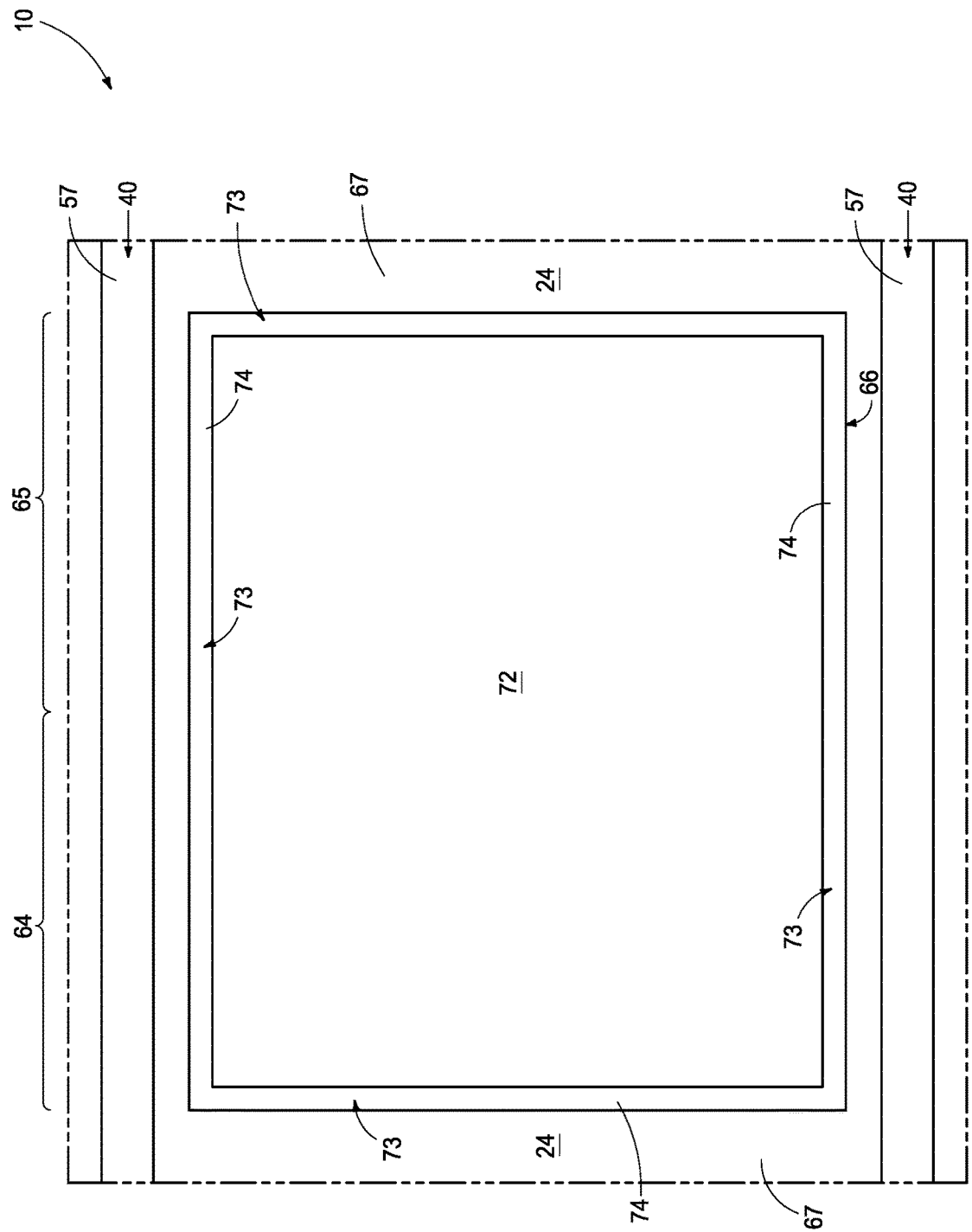

Referring to FIGS. 16 and 17, insulator material 74 has been formed in at least some of void space 73 with in one embodiment and as shown insulator material 74 filling all of void space 73. Ideally, insulator material 74 is formed by a highly conformal deposition method to enable complete or near-complete filling of void space 73, for example by atomic layer deposition. Such may then be planarized back. Insulator material 74 and insulative material 72 may be of the same composition relative one another or insulator material 74 may comprise a different composition from that of insulative material 72. In one embodiment even where insulator material 74 and insulative material 72 are of the same composition relative one another, a perceptible interface 87 may be there-between as shown. Again, channel-material strings 53 may be formed before or after forming insulative material 72 and insulator material 74.

Referring to 18-20, horizontally-elongated trenches 40 have been formed into stack 18 to form laterally-spaced memory-block regions 58 extending from memory-array region 12 into stair-step region 13. Conductive vias (not shown) to steps 63 and through array vias (not shown) in stair-step region 13 may be formed before or after forming trenches 40.

Referring to FIGS. 21-27, and in one embodiment, material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56. Treads 75 may be considered as individually comprising an uppermost conductive surface 23.

A thin insulative liner (e.g., $Al_2O_3$ and not shown) may be formed before forming conducting material 48. Approximate locations of transistors and/or memory cells 56 are indicated with a bracket in FIG. 26 and some with dashed outlines in FIGS. 22, 25, and 27, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 26) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally a laterally-outer region of an insulative storage material (e.g., a silicon nitride material 32). An example material 30 is one or more of silicon hafnium oxide and silicon dioxide.

Intervening material 57 has been formed laterally-between and longitudinally-along immediately-laterally-adjacent memory blocks 58. Intervening material 57 may provide lateral electrical isolation (insulation) between immediately-laterally-adjacent memory-blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (not shown).

Any other attribute(s) or aspect(s) as shown and/or described herein with respect to other embodiments may be used in the embodiments shown and described with reference to the above embodiments.

Figure 28:
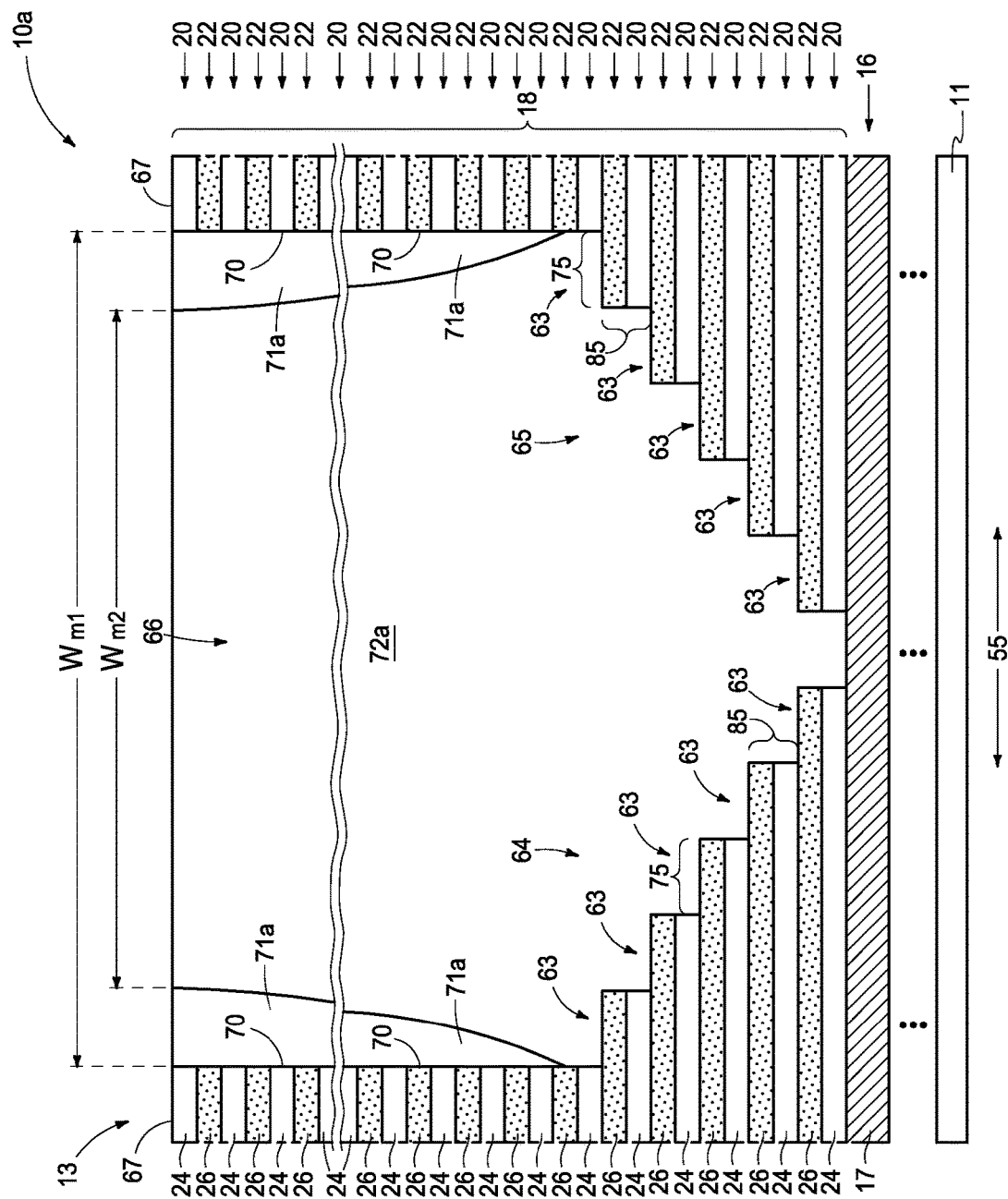

Processing relative to an alternate construction 10a is next-described with reference to FIGS. 28 and 29. Like numerals from the above-described embodiments have been used where appropriate, with some construction differences being indicated with the suffix "a" or with different numerals. FIG. 28 corresponds in processing sequence to that of FIG. 13. In construction 10a, sacrificial material 71a where between one of cavity sidewalls 70/85 and insulative material 72a is wider at its top than at its bottom, at least at the start of the act of removing at least some of sacrificial material 71a. Sacrificial material 71a may be so-deposited in a largely non-conformal manner, for example by physical vapor deposition or varying chemical vapor deposition parameters that result in the example non-conformal deposition. Sacrificial material 71a may not be directly against any tread 75 or any riser 85 (as shown). Alternately, sacrificial material 71a may be directly against one or more treads 75 (not shown) and/or one or more risers 85 (not shown). Regardless, sacrificial material 71a as initially-formed may be directly against one or more treads 75 and/or one or more risers 85 and, if so, which may or may not be removed when conducting a spacer-like etch or a timed isotropic etch thereof. Sacrificial material 71a as deposited in a non-conformal manner may have tendency to deposit against at least some treads 75 and risers 85 in shallower cavities 66 as compared to deeper cavities 66.

Figure 24:
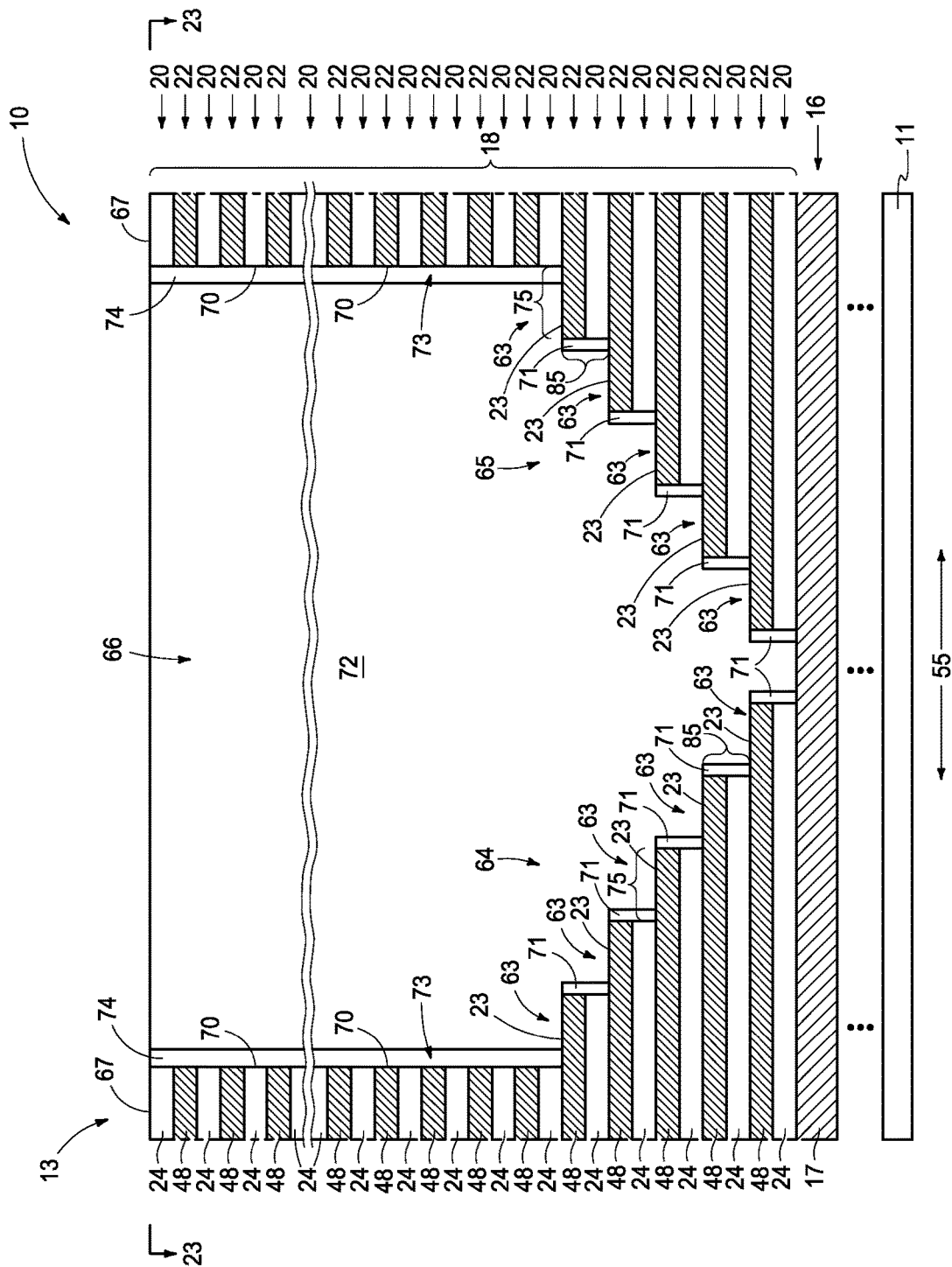
Figure 27:
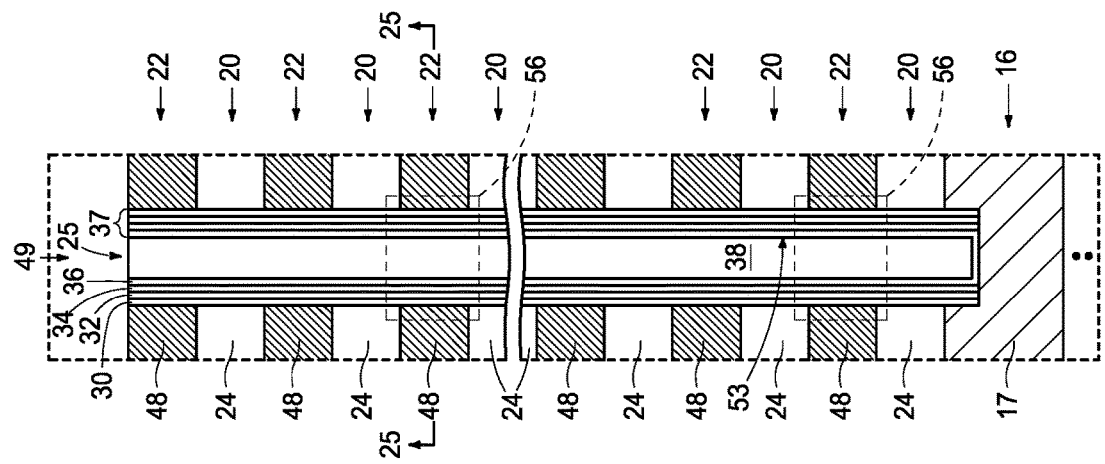
Figure 25:
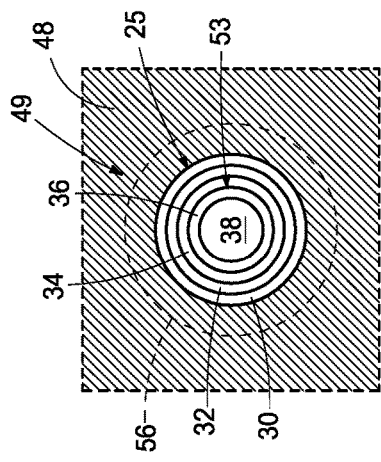
Figure 26:
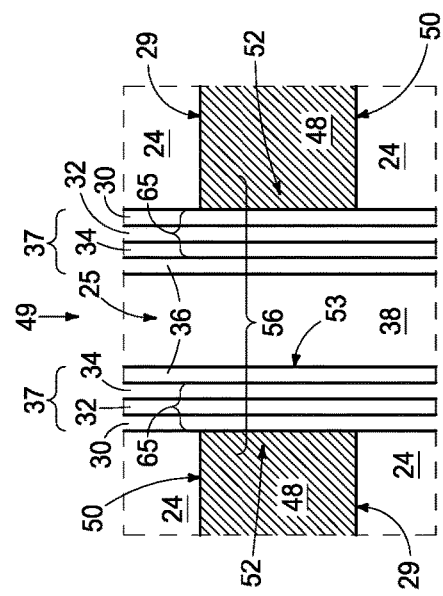
Figure 29:
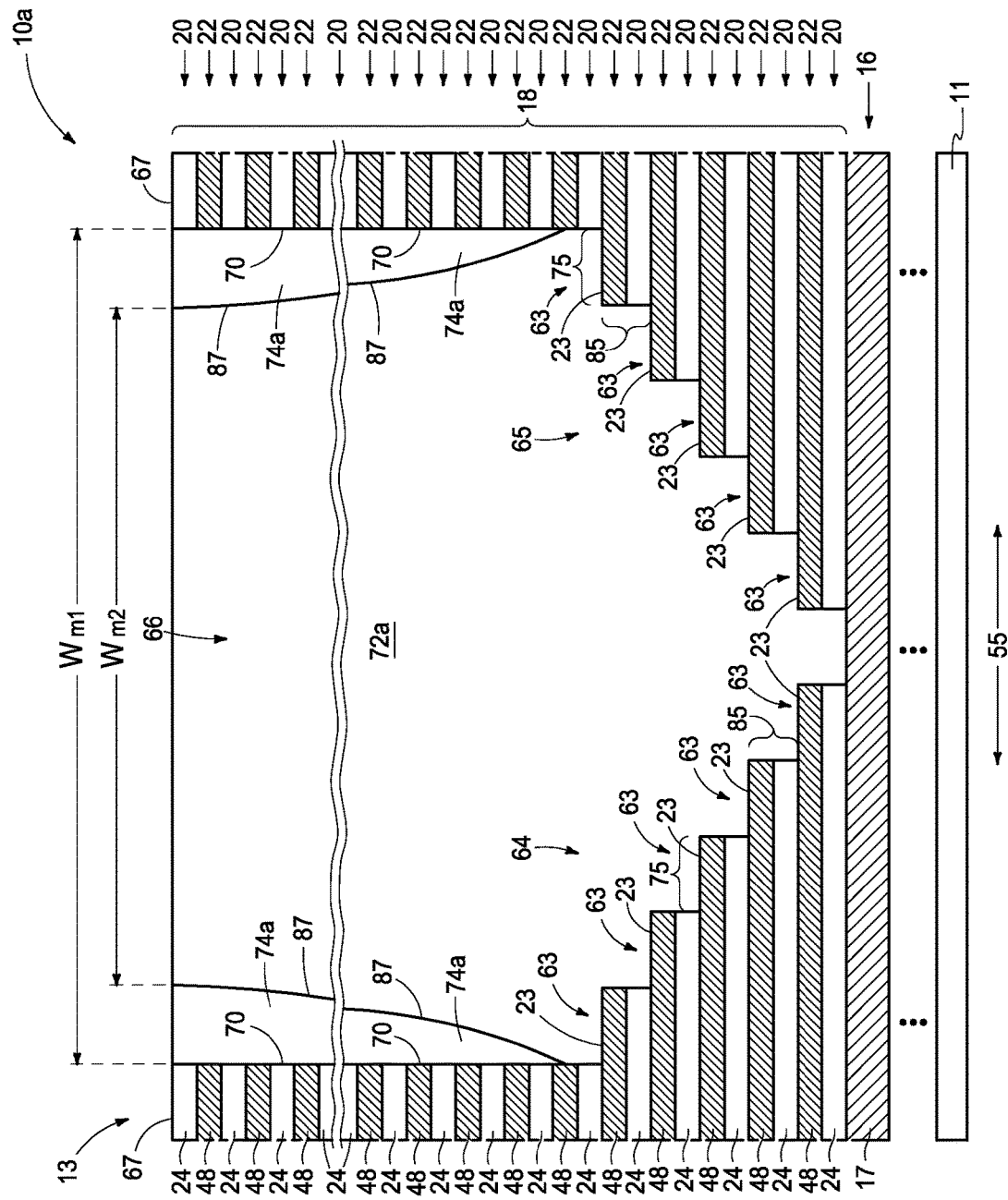

FIG. 29 shows subsequent processing through and analogous to that shown by FIG. 24 where sacrificial material 71a (not shown) has been removed and insulator material 74a deposited into void space 73a (e.g., regardless of composition and/or densification of insulator material 74a). In one embodiment and as shown, construction 10a has insulative material 72a having a maximum width $W_{m1}$ in its lowest half that is greater than a maximum width $W_{m2}$ in its uppermost half in at least one vertical cross-section (e.g., that of FIG. 29). A non-conformal deposition as shown in construction 10a as compared to construction 10 may be preferred to provide a wider anchoring effect in the lower half of insulative material 72a and to provide more volume in void space 73a for gas emission from insulative material 72a if densified after its deposition.

Any other attribute(s) or aspect(s) as shown and/or described herein with respect to other embodiments may be used.

The above figures with respect to constructions 10 and 10a show examples where sacrificial material 71 is circumferentially about all of at least an uppermost portion of cavity sidewalls 70 at start of the act of removing the sacrificial material. Alternately, the sacrificial material may be circumferentially about less-than-all of at least an uppermost portion of cavity sidewalls at start of the act of removing the sacrificial material. Example such embodiments are next described starting with reference to FIGS. 30, 31, 32, and 33 with respect to constructions 10b, 10c, 10d, and 10e, respectively. Like numerals from the above-described embodiments have been used where appropriate, with some construction differences being indicated with the suffix's "b", "c", "d", and "e", respectively.

Figure 30:
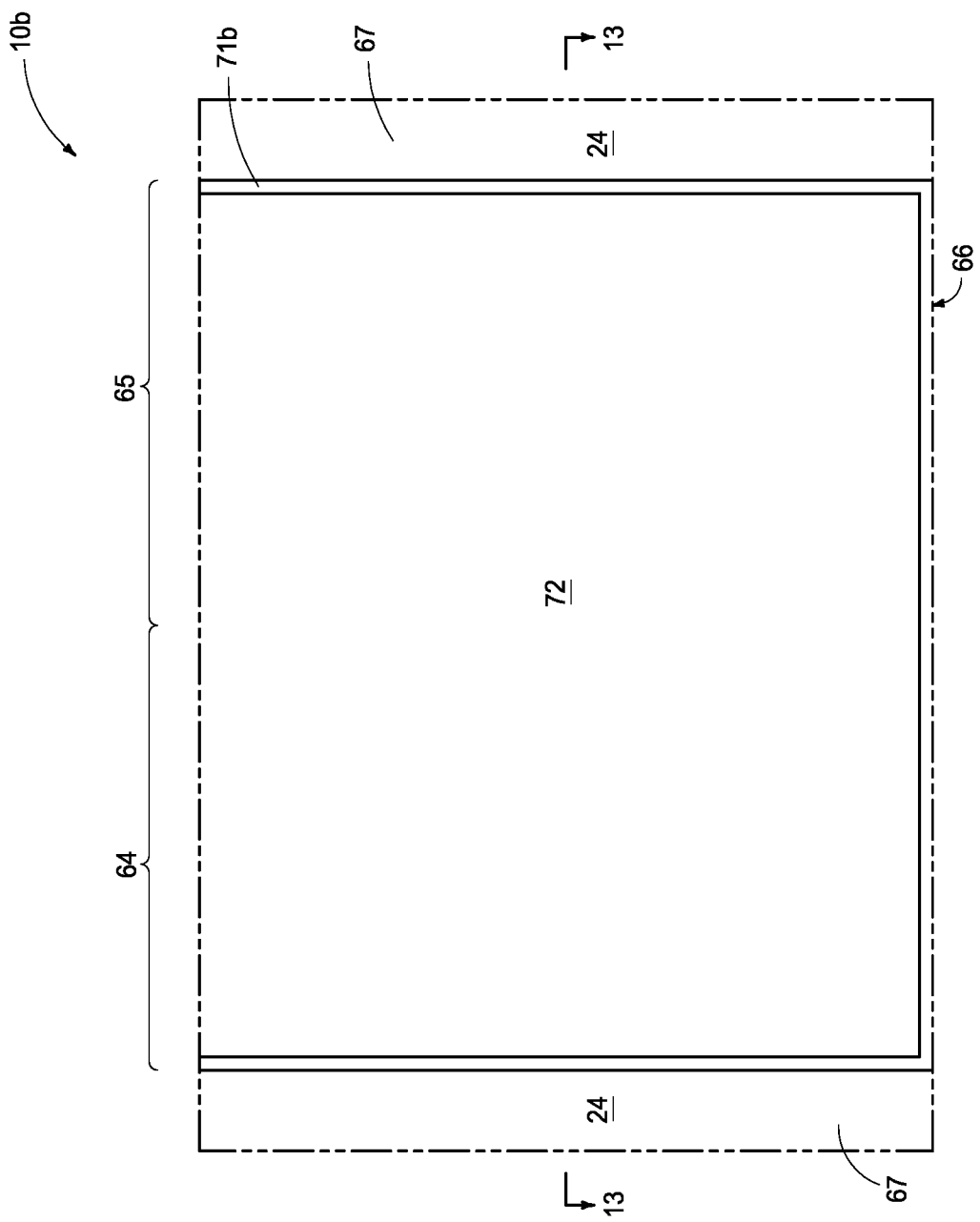
Figure 31:
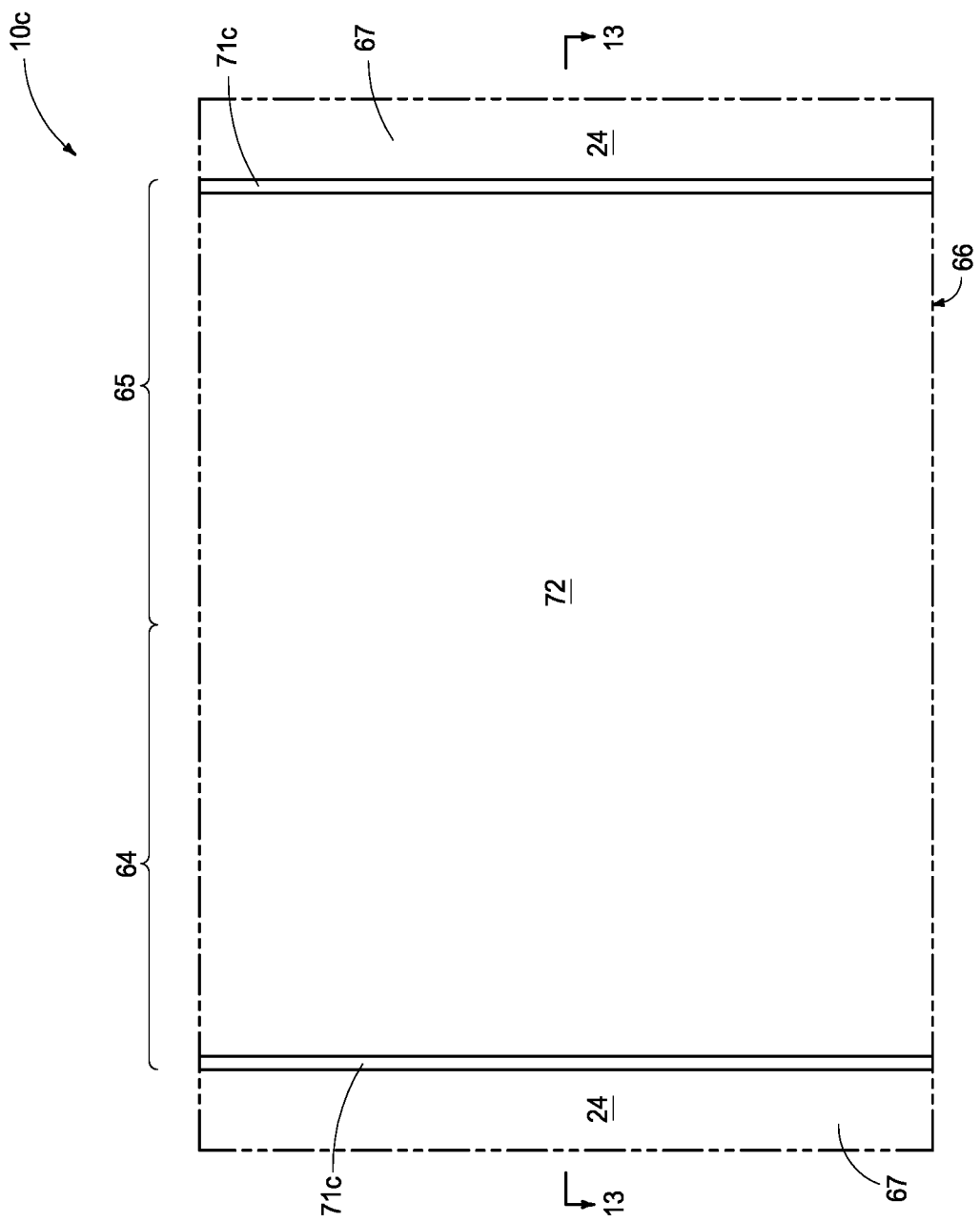
Figure 32:
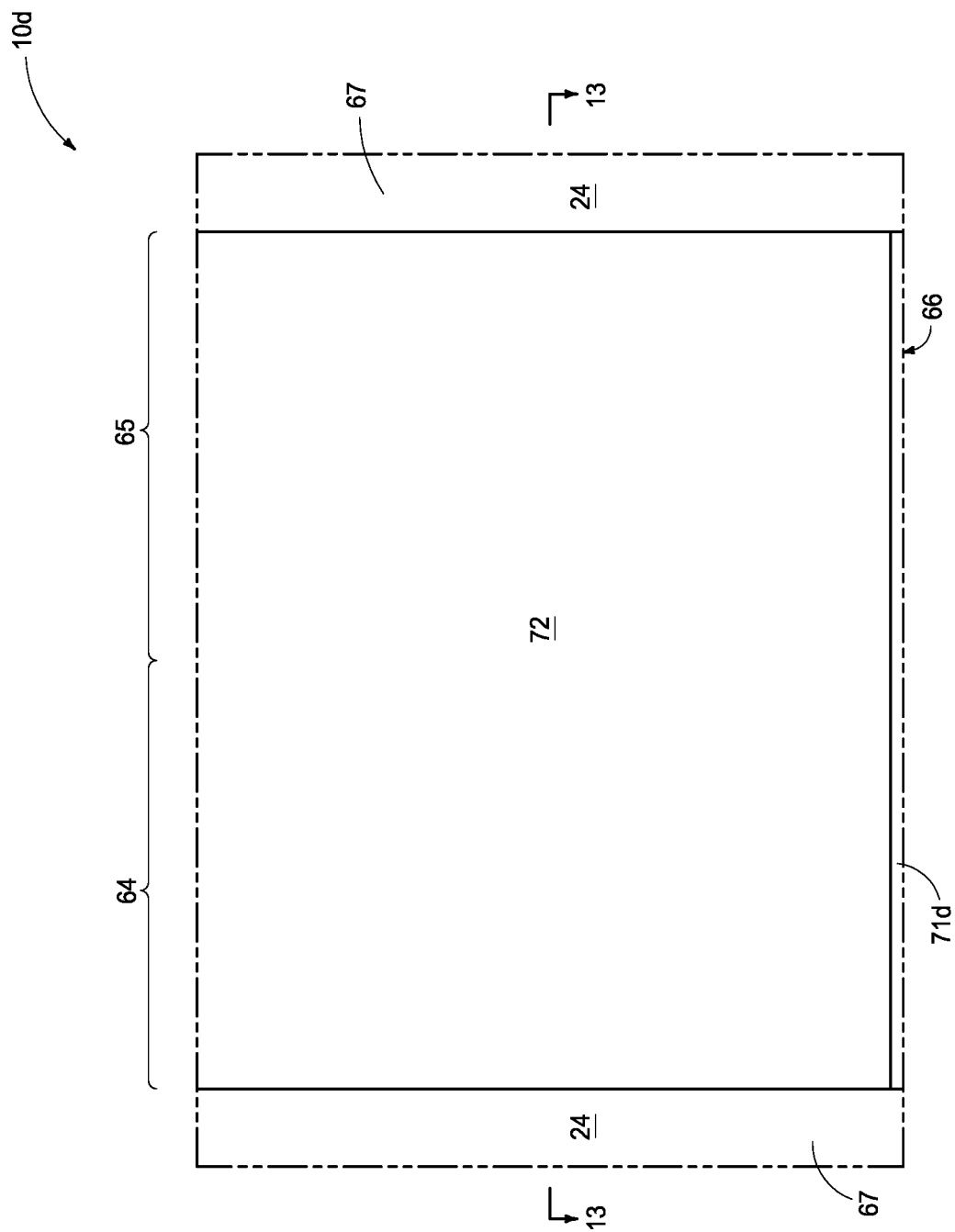
Figure 33:
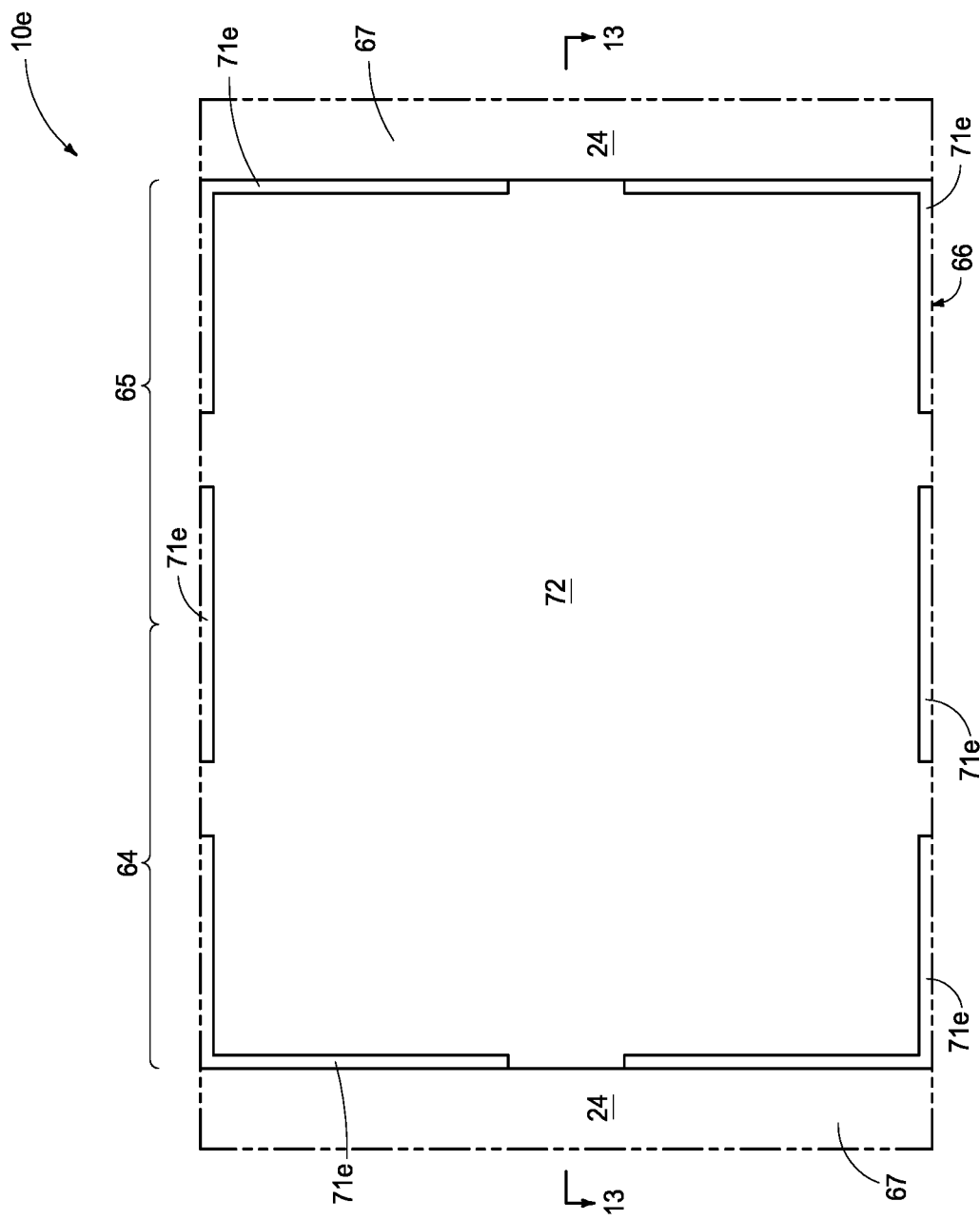
Figure 34:
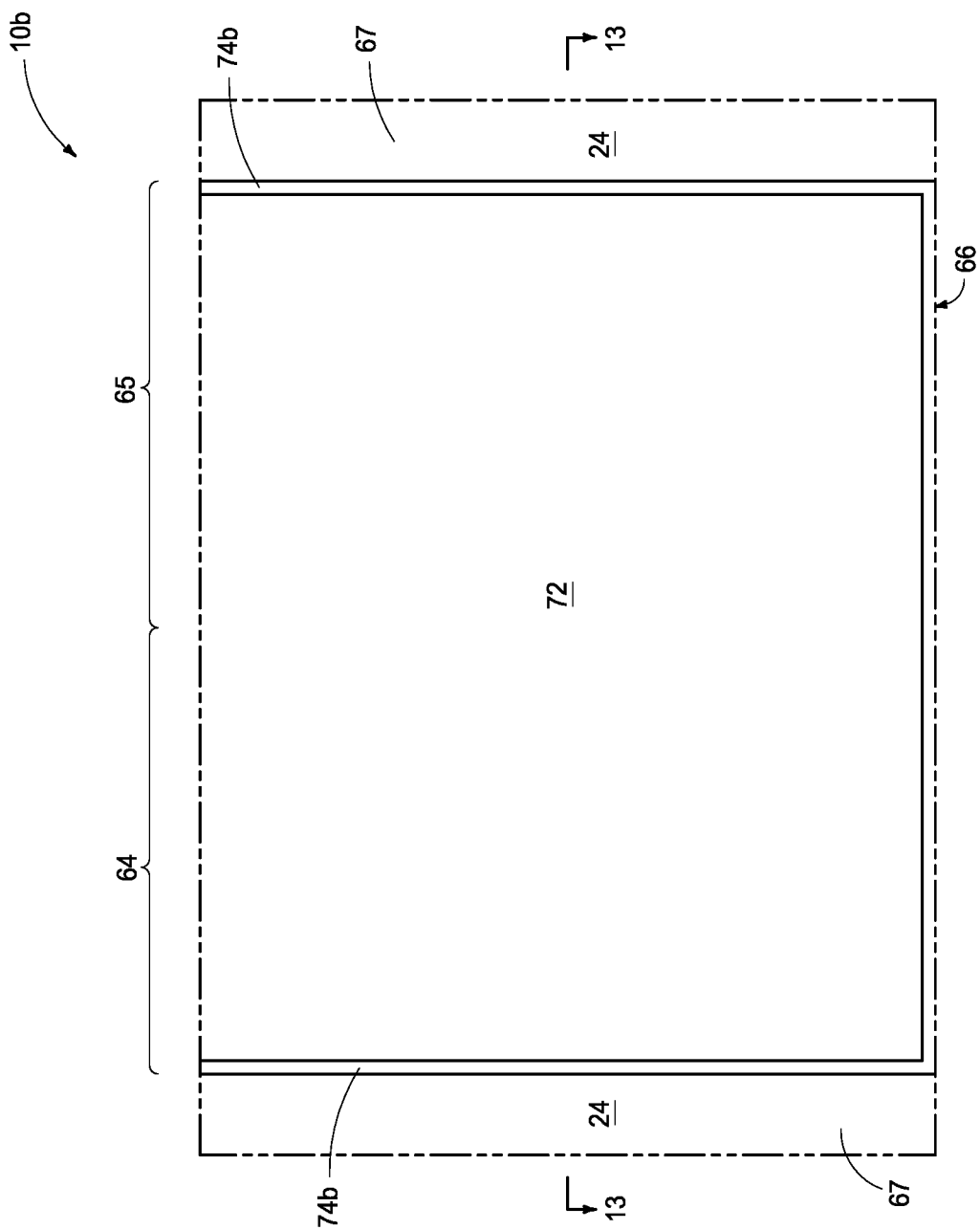
Figure 35:
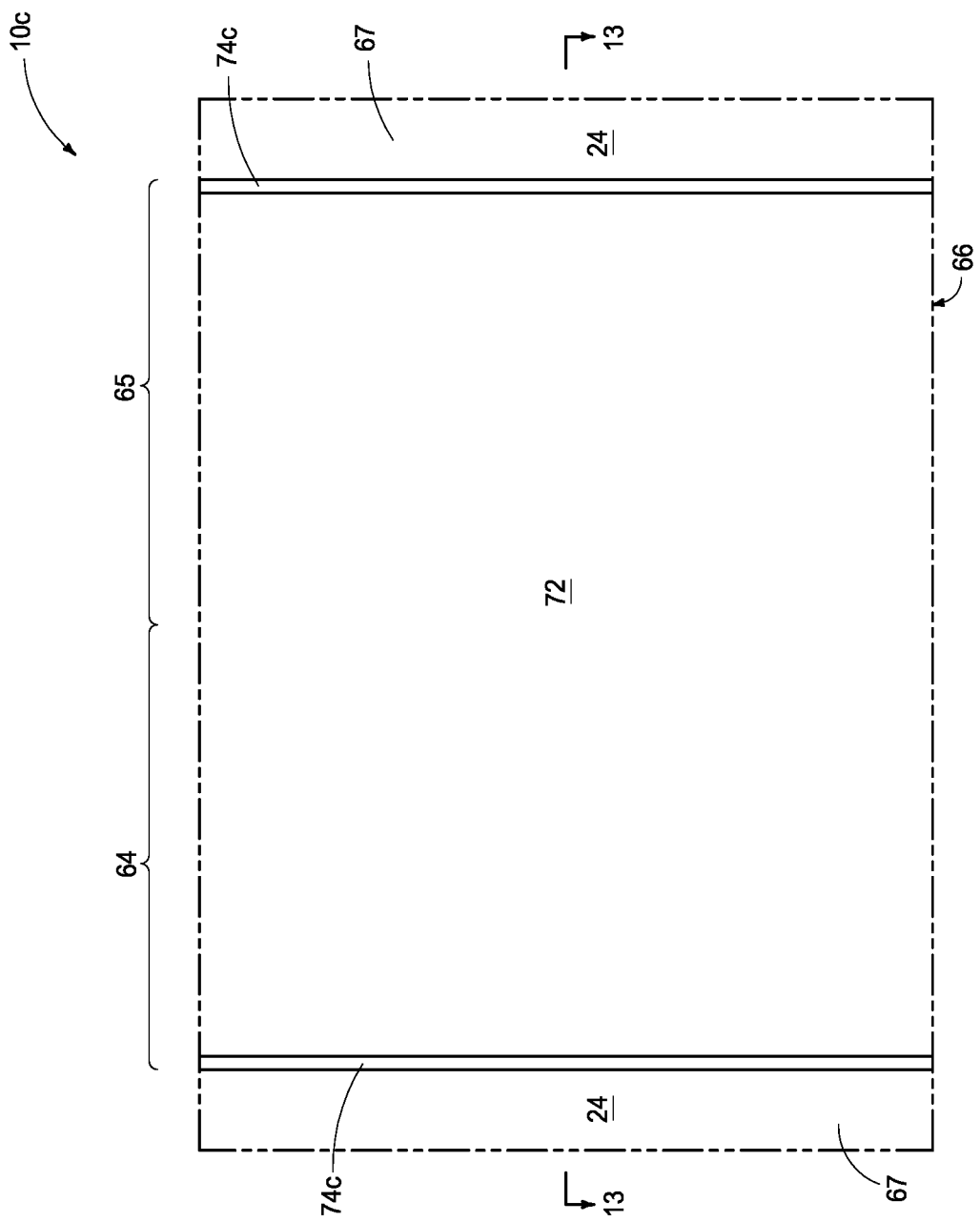

Each of FIGS. 30, 31, 32, and 33 correspond in processing sequence to that of FIG. 12. Construction 10b of FIG. 30 shows sacrificial material 71b received about three complete sides of the example depicted cavity outline that is a rectangle. FIG. 31 shows two sides occupied by sacrificial material 71c. Such two sides are shown being opposite one another although such could be adjacent one another. FIG. 32 shows only one side of the example rectangular cavity occupied by sacrificial material 73d. FIG. 33 shows an embodiment wherein some (all as shown) of the example rectangular-sided cavity 66 is segmented circumferentially by sacrificial material 71e. The embodiments of FIGS. 30-31 may be formed by any existing or future-developed manners. For example, the sacrificial material may be initially deposited as shown in FIGS. 8 and 9 and subsequently subtractively etched. Alternately, the places where the sacrificial material is not desired could be masked prior to deposition, and the masking removed thereafter.

FIGS. 34-37 show subsequent processing having occurred wherein the respective sacrificial materials 71b, 71c, 71d, and 71e (not shown) have been removed and insulator materials 74b, 74c, 74d, and 74e, respectively, have been formed in their place.

Any other attribute(s) or aspect(s) as shown and/or described herein with respect to other embodiments may be used.

Alternate embodiment constructions may result from method embodiments described above, or otherwise. Regardless, embodiments of the invention encompass existing or future-developed integrated circuitry independent of method of manufacture. Nevertheless, such circuitry may have any of the attributes as described herein in method embodiments. Likewise, the above-described method embodiments may incorporate, form, and/or have any of the attributes described with respect to device embodiments.

In one embodiment, integrated circuitry in accordance with an embodiment of the invention comprises a three-dimensional (3D) array (e.g., 12) comprising tiers of electronic components (e.g., 56). The circuitry comprises a cavity (e.g., 66) comprising a stair-step structure (e.g., 64 or 65) laterally-adjacent the 3D array. Insulating material (e.g., 72a, 74a) is in the cavity above the stairstep structure. The insulating material comprises a radially-inner insulative material (e.g., 72a) that has a maximum width (e.g., width $W_{m1}$) in its lowest half that is greater than a maximum width (e.g., width $W_{m2}$) in its uppermost half in at least one vertical cross-section. The insulating material comprises a radially-outer insulator material (e.g., 74a) radially outside of the radially-inner insulative material. The radially-outer insulative material where between a sidewall (e.g., 70) of the cavity and the radially-inner insulative material is wider at its top than at its bottom in the at least one vertical cross-section. An interface (e.g., 87) is between the radially-outer insulator material and the radially-inner insulative material.

In one embodiment, the radially-outer insulator material and the radially-inner insulative material are of the same composition relative one another. In one embodiment, the radially-outer insulator material comprises a different composition from that of the radially-inner insulative material. In one embodiment, the electronic components comprise transistors and in one embodiment comprise memory cells. In one embodiment, the stair-step structure comprises part of NAND. In one embodiment, the integrated circuitry comprises CMOS-under-array circuitry.

Any other attribute(s) or aspect(s) as shown and/or described herein with respect to other embodiments may be used.

In one embodiment, integrated circuitry in accordance with an embodiment of the invention comprises a three-dimensional (3D) array (e.g., 12) comprising tiers of electronic components (e.g., 56). The integrated circuitry comprises a cavity (e.g., 66) comprising a stair-step structure (e.g., 64 or 65) laterally-adjacent the 3D array. The stair-step structure has steps (e.g., 63) individually comprising a tread (e.g., 75) and a riser (e.g., 85). The treads individually comprise an uppermost conductive surface (e.g., 23). Insulating material (e.g., 72a, 74a) is in the cavity above the stair-step structure. The insulating material comprises a radially-inner insulative material (e.g., 72a) and a radially-outer insulator material (e.g., 74a) radially outside of the radially-inner insulative material. The radially-outer insulator material is not directly against the uppermost conductive surface of any of the treads. An interface (e.g., 87) is between the radially-outer insulator material and the radially-inner insulative material. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming integrated circuitry comprises forming a stack comprising vertically-alternating first tiers and second tiers. The stack comprises a cavity therein that comprises a stair-step structure. At least a portion of sidewalls of the cavity is lined with sacrificial material. Insulative material is formed in the cavity radially inward of the sacrificial material. At least some of the sacrificial material is removed from being between the cavity sidewalls and the insulative material to form a void space there-between. Insulator material is formed in at least some of the void space.

In some embodiments, a method used in forming a memory array comprising strings of memory cells comprises forming a stack comprising vertically-alternating first tiers and second tiers. The stack comprises a memory-array region and a stair-step region. A cavity comprising a stair-step structure is formed into the stack in the stair-step region. At least a portion of sidewalls of the cavity is lined with sacrificial material. Insulative material is formed in the cavity radially inward of the sacrificial material. At least some of the sacrificial material is removed from being between the cavity sidewalls and the insulative material to form a void space there-between. Insulator material is formed in at least some of the void space. Channel-material strings of memory cells are formed through the first and second tiers in the memory-array region. Horizontally-elongated trenches are formed into the stack to form laterally-spaced memory-block regions that extend from the memory-array region into the stair-step region.

In some embodiments, integrated circuitry comprising a three-dimensional (3D) array comprises tiers of electronic components. The integrated circuitry comprises a cavity comprising a stair-step structure laterally-adjacent the 3D array. Insulating material in the cavity is above the stair-step structure. The insulating material comprise a radially-inner insulative material that has a maximum width in its lowest half that is greater than a maximum width in its uppermost half in at least one vertical cross-section. A radially-outer insulator material is radially outside of the radially-inner insulative material. The radially-outer insulative material where between a sidewall of the cavity and the radially-inner insulative material is wider at its top than at its bottom in the at least one vertical cross-section. An interface is between the radially-outer insulator material and the radially-inner insulative material.

In some embodiments, integrated circuitry comprising a three-dimensional (3D) array comprises tiers of electronic components. The integrated circuitry comprises a cavity comprising a stair-step structure laterally-adjacent the 3D array. The stair-step structure has steps that individually comprise a tread and a riser. The treads individually comprise an uppermost conductive surface. Insulating material in the cavity is above the stair-step structure. The insulating material comprises a radially-inner insulative material. A radially-outer insulator material is radially outside of the radially-inner insulative material. The radially-outer insulator material is not directly against the uppermost conductive surface of any of the treads. An interface is between the radially-outer insulator material and the radially-inner insulative material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry, comprising:
    forming a stack comprising vertically-alternating first tiers and second tiers, the stack comprising a cavity therein that comprises a stair-step structure;
    lining at least a portion of sidewalls of the cavity with sacrificial material;
    forming insulative material in the cavity radially inward of the sacrificial material;
    removing at least some of the sacrificial material from being between the cavity sidewalls and the insulative material to form a void space there-between; and
    forming insulator material in at least some of the void space.

2. The method of claim 1 wherein the sacrificial material is laterally over all of the cavity sidewalls at start of the removing.

3. The method of claim 1 wherein the sacrificial material is laterally over less-than-all of the cavity sidewalls at start of the removing.

4. The method of claim 1 wherein the sacrificial material is circumferentially about all of at least an uppermost portion of the cavity sidewalls at start of the removing.

5. The method of claim 1 wherein the sacrificial material is circumferentially about less-than-all of at least an uppermost portion of the cavity sidewalls at start of the removing.

6. The method of claim 1 wherein the sacrificial material where between one of the cavity sidewalls and the insulative material is wider at its top than at its bottom at start of the removing.

7. The method of claim 1 wherein the sacrificial material where between one of the cavity sidewalls and the insulative material is of constant thickness from its top to its bottom at start of the removing.

8. The method of claim 1 wherein the insulative material has a maximum width in its lowest half that is greater than a maximum width in its uppermost half in at least one vertical cross-section.

9. The method of claim 1 wherein forming the insulator material fills all of the void space.

10. The method of claim 1 comprising forming multiple of the cavities that individually comprise said stair-step structure; said acts of lining, forming insulative material, removing, and forming insulator material occurring in the multiple cavities.

11. The method of claim 1 where the stair-step structure has steps individually comprising a tread and a riser, the sacrificial material being formed atop the treads and aside the risers, and further comprising:
    prior to forming the insulative material, removing the sacrificial material from being atop the treads except where immediately-aside the risers.

12. The method of claim 1 wherein the removing comprises isotropic etching of the sacrificial material selectively relative to the insulative material.

13. The method of claim 1 wherein forming the insulative material comprises flowing spin-on-dielectric into the cavity.

14. The method of claim 13 comprising fully densifying the spin-on-dielectric prior to forming the insulator material.

15. The method of claim 14 wherein the fully densifying comprises gas emission from the spin-on-dielectric into the void space.

16. The method of claim 14 comprising partially and only partially densifying the spin-on-dielectric prior to the removing.

17. The method of claim 16 wherein the partially densifying is at least 10% of the fully-densifying density.

18. The method of claim 16 wherein the partially densifying is no more than 75% of the fully-densifying density.

19. The method of claim 16 wherein the partially densifying is 10% to 75% of the fully-densifying density.

20. The method of claim 16 wherein the partially densifying is 33% to 60% of the fully-densifying density.

21. The method of claim 16 comprising fully densifying the spin-on-dielectric prior to forming the insulator material.

22. A method used in forming a memory array comprising strings of memory cells, comprising:
    forming a stack comprising vertically-alternating first tiers and second tiers, the stack comprising a memory-array region and a stair-step region;
    forming a cavity comprising a stair-step structure into the stack in the stair-step region;
    lining at least a portion of sidewalls of the cavity with sacrificial material;
    forming insulative material in the cavity radially inward of the sacrificial material;
    removing at least some of the sacrificial material from being between the cavity sidewalls and the insulative material to form a void space there-between;
    forming insulator material in at least some of the void space;
    forming channel-material strings of memory cells through the first and second tiers in the memory-array region; and
    forming horizontally-elongated trenches into the stack to form laterally-spaced memory-block regions extending from the memory-array region into the stair-step region.

23. The method of claim 22 wherein the memory array and the strings comprise NAND.

24. Integrated circuitry comprising:
    a three-dimensional (3D) array comprising tiers of electronic components;
    a cavity comprising a stair-step structure laterally-adjacent the 3D array, the stair-step structure having steps individually comprising a tread and a riser; and
    insulating material in the cavity above the stair-step structure, the insulating material comprising:
        a radially-inner insulative material that has a maximum width in its lowest half that is greater than a maximum width in its uppermost half in at least one vertical cross-section, the radially-inner insulative material being continuously directly above multiple of the treads;

a radially-outer insulator material radially outside of the radially-inner insulative material, the radially-outer insulative material where between a sidewall of the cavity and the radially-inner insulative material being wider at its top than at its bottom in the at least one vertical cross-section; and an interface between the radially-outer insulator material and the radially-inner insulative material.

25. The integrated circuitry of claim 24 wherein the radially-outer insulator material and the radially-inner insulative material are of the same composition relative one another.

26. The integrated circuitry of claim 24 wherein the radially-outer insulator material comprises a different composition from that of the radially-inner insulative material.

27. The integrated circuitry of claim 24 wherein the electronic components comprise transistors.

28. The integrated circuitry of claim 24 wherein the radially-outer insulative material is directly above only one of the treads.

29. The integrated circuitry of claim 24 wherein the electronic components comprise memory cells.

30. The integrated circuitry of claim 29 wherein the stair-step structure comprises part of NAND.

31. The integrated circuitry of claim 30 comprising CMOS-under-array circuitry.

32. Integrated circuitry comprising:
a three-dimensional (3D) array comprising tiers of electronic components;
a cavity comprising a stair-step structure laterally-adjacent the 3D array, the stair-step structure having steps individually comprising a tread and a riser, the treads individually comprising an uppermost conductive surface; and
insulating material in the cavity above the stair-step structure, the insulating material comprising:
a radially-inner insulative material;
a radially-outer insulator material radially outside of the radially-inner insulative material, the radially-outer insulator material not being directly against the uppermost conductive surface of any of the treads and not being directly under the radially-inner insulator material; and
an interface between the radially-outer insulator material and the radially-inner insulative material.

33. The integrated circuitry of claim 32 wherein the radially-outer insulator material and the radially-inner insulative material are of the same composition relative one another.

34. The integrated circuitry of claim 32 wherein the radially-outer insulator material comprises a different composition from that of the radially-inner insulative material.

35. The integrated circuitry of claim 32 wherein the stair-step structure comprises part of NAND.

* * * * *